US012648289B2

(12) United States Patent
Bae et al.

(10) Patent No.: US 12,648,289 B2
(45) Date of Patent: Jun. 2, 2026

(54) DISPLAY DEVICE INCLUDING PHOTO-SENSING PIXELS

(71) Applicant: SAMSUNG DISPLAY CO., LTD., Yongin-si (KR)

(72) Inventors: Kwang Soo Bae, Yongin-si (KR); Gun Hee Kim, Yongin-si (KR); Dae Young Lee, Yongin-si (KR); Sang Hwan Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 546 days.

(21) Appl. No.: 18/161,029

(22) Filed: Jan. 27, 2023

(65) Prior Publication Data

US 2023/0329020 A1 Oct. 12, 2023

(30) Foreign Application Priority Data

Apr. 7, 2022 (KR) ........................ 10-2022-0043445

(51) Int. Cl.
| | |
|---|---|
| *H10K 39/34* | (2026.01) |
| *G06F 3/044* | (2006.01) |
| *G06V 40/13* | (2022.01) |
| *H10K 59/122* | (2023.01) |
| *H10K 59/38* | (2023.01) |
| *H10K 59/40* | (2023.01) |
| *H10K 59/80* | (2023.01) |

(52) U.S. Cl.
CPC ........... *H10K 39/34* (2023.02); *G06F 3/0445* (2019.05); *G06V 40/1318* (2022.01); *H10K 59/122* (2023.02); *H10K 59/38* (2023.02);

*H10K 59/40* (2023.02); *H10K 59/873* (2023.02); *H10K 59/8792* (2023.02)

(58) Field of Classification Search
CPC ........ H10K 39/34; H10K 59/38; H10K 59/65; H10K 50/60; H10K 59/352; G09G 2300/0452
See application file for complete search history.

(56) References Cited

U.S. PATENT DOCUMENTS

| | | |
|---|---|---|
| 8,492,728 B2 | 7/2013 | Antonuk |
| 9,167,994 B2 | 10/2015 | Akiyama |
| | (Continued) | |

FOREIGN PATENT DOCUMENTS

| | | |
|---|---|---|
| CN | 112055893 | 12/2020 |
| JP | 202139342 | 3/2021 |
| | (Continued) | |

*Primary Examiner* — Alia Sabur
(74) *Attorney, Agent, or Firm* — F. CHAU & ASSOCIATES, LLC

(57) ABSTRACT

A display device includes a substrate; and a plurality of unit pixels disposed on the substrate and including sub-pixels and photo-sensing pixels. Each of the sub-pixels includes a light emitting element and a light emitting area from which light is emitted. Each of the photo-sensing pixels includes a light receiving area and a light receiving element disposed therein and outputting a sensing signal corresponding to a degree of sensed light. The light emitting area and the light receiving area are spaced apart from each other on the substrate. The light emitting area and the light receiving area each have a polygonal shape. Aa shape of the light emitting area is different from a shape of the light receiving area.

20 Claims, 19 Drawing Sheets

(56)                    References Cited

U.S. PATENT DOCUMENTS

| | | | |
|---|---|---|---|
| 10,936,126 B2 | 3/2021 | Lee et al. | |
| 11,543,904 B2 | 1/2023 | Bok et al. | |
| 11,899,862 B2 | 2/2024 | Bok et al. | |
| 2020/0111851 A1* | 4/2020 | Park | H10K 39/32 |
| 2020/0133414 A1* | 4/2020 | Lee | G06F 3/044 |
| 2020/0251688 A1* | 8/2020 | Chung | H10K 59/38 |
| 2021/0066669 A1 | 3/2021 | Kubota et al. | |
| 2021/0151524 A1 | 5/2021 | Tang et al. | |
| 2022/0351540 A1* | 11/2022 | Hai | H10K 59/124 |
| 2022/0352288 A1* | 11/2022 | Chen | H10K 59/126 |
| 2023/0015554 A1* | 1/2023 | Zhu | H10K 59/12 |
| 2023/0329020 A1* | 10/2023 | Bae | H10K 59/80515 |
| 2024/0341161 A1* | 10/2024 | Hai | H10K 59/353 |
| 2024/0381737 A1* | 11/2024 | Ikeda | H05B 33/12 |

FOREIGN PATENT DOCUMENTS

| | | |
|---|---|---|
| KR | 10-2013-0033278 A | 4/2013 |
| KR | 10-2020-0049959 A | 5/2020 |
| KR | 10-2021-0005290 | 1/2021 |
| KR | 10-2021-0082316 A | 7/2021 |
| KR | 10-2021-0086907 A | 7/2021 |
| WO | WO 2020119132 | 6/2020 |

* cited by examiner

DD

DP

PSR

DA(SA)

NDA(NSA)

SPX(PXL)

DCP

DRIVING CIRCUIT

PANEL DRIVER — PNDP

FINGERPRINT DETECTOR — FPDP

DR2

DR1

EA

DD

WD

OCA

TS ⎤
DP ⎦ DM

DR3

LD: AE, EML, CE
OPD: E1, OPL, E2

LD: AE, EML, CE
OPD: E1, OPL, E2

M4

EML_R

H3

EML_R

LD: AE, EML, CE
OPD: E1, OPL, E2

LD: AE, EML, CE
OPD: E1, OPL, E2

LD: AE, EML, CE
OPD: E1, OPL, E2

DISPLAY DEVICE INCLUDING PHOTO-SENSING PIXELS

CROSS-REFERENCE TO RELATED APPLICATION

This application claims priority under 35 U.S.C. § 119 to Korean Patent Application No. 10-2022-0043445, filed in the Korean Intellectual Property Office on Apr. 7, 2022, the entire contents of which are herein incorporated by reference.

TECHNICAL FIELD

The present invention relates to a display device and, more particularly, to a display device including photo-sensing pixels.

DISCUSSION OF THE RELATED ART

It is becoming increasingly common to utilize biometric sensors in association with display device, for example, when used in such devices as smart phones and tablet computers. These biometric sensors may be used to sense and validate biometric information so as to authenticate a user. Examples of biometric information used for this purpose include fingerprints. In order to provide a fingerprint sensing function, a fingerprint sensor may be embedded within or attached to a display device.

A light-sensing type of fingerprint sensor may include a light source and a light sensor. The light sensor may obtain fingerprint information by sensing light that has been reflected off of a user's finger.

SUMMARY

A display device includes a substrate; and a plurality of unit pixels disposed on the substrate and including sub-pixels and photo-sensing pixels, wherein each of the sub-pixels includes a light emitting element and a light emitting area from which light is emitted, wherein each of the photo-sensing pixels includes a light receiving area and a light receiving element disposed therein and outputting a sensing signal corresponding to a degree of sensed light, wherein the light emitting area and the light receiving area are spaced apart from each other on the substrate, wherein the light emitting area and the light receiving area each have a polygonal shape, and wherein a shape of the light emitting area is different from a shape of the light receiving area.

The light emitting area may have a hexagonal shape, and the light receiving area may have a quadrilateral shape.

The light receiving may have a square shape.

One of the plurality of unit pixels may include a first sub-pixel disposed on a first column of the substrate; two (2-1)-th sub-pixels disposed on a second column that is adjacent to the first column in a first direction; a third sub-pixel disposed on a third column that is adjacent to the second column in the first direction; two (2-2)-th sub-pixels disposed on a fourth column that is adjacent to the third column in the first direction; two first photo-sensing pixels disposed on the first column; and two second photo-sensing pixels disposed on the third column.

The two (2-1)-th sub-pixels and the two (2-2)-th sub-pixels may emit light of a same color; and colors of light emitted by the two (2-1)-th sub-pixels and the two (2-2)-th sub-pixels, a color of light emitted by the first sub-pixel, and a color of light emitted by the third sub-pixel may be all different from one another.

The two first photo-sensing pixels may face each other with the first sub-pixel disposed therebetween in the first column, and wherein the two second photo-sensing pixels may face each other with the third sub-pixel disposed therebetween in the third column.

The first sub-pixel and the third sub-pixel may be disposed in a same row, and wherein a distance between the first sub-pixel and the third sub-pixel in the same row may be different from a distance between the first sub-pixel and the first photo-sensing pixel in the first column.

Each of the first sub-pixel and the third sub-pixel may include a light emitting area having a hexagonal shape extending primarily in the first direction, and wherein each of the two (2-1)-th sub-pixels and the two (2-2)-th sub-pixels may include a light emitting area of a hexagonal shape extending primarily in a second direction crossing the first direction.

The one unit pixel among the plurality of unit pixels and an adjacent unit pixel among the plurality of unit pixels disposed in a same column as the one unit pixel, in a second direction crossing the first direction, may share the two first photo-sensing pixels or the two second photo-sensing pixels.

The light emitting element may include an anode electrode, a light emitting layer disposed on the anode electrode, and a cathode electrode disposed on the light emitting layer, and wherein the light receiving element may include a first electrode, a light receiving layer disposed on the first electrode, and a second electrode disposed on the light receiving layer.

The cathode electrode of the light emitting element and the second electrode of the light receiving element may be part of a continuous single structure and may be electrically connected to one another.

The display device may further include a pixel defining film that is disposed on the anode electrode of the light emitting element and the first electrode of the light receiving element and includes a first opening exposing a portion of the anode electrode and a second opening exposing a portion of the first electrode; and a thin film encapsulation layer that is disposed on the cathode electrode of the light emitting element and the second electrode of the light receiving element and at least partially covers the light emitting element and the light receiving element.

The first opening may correspond to the light emitting area, and the second opening may correspond to the light receiving area.

The display device may further include a first color filter disposed on the thin film encapsulation layer in the light emitting area; a second color filter disposed on the thin film encapsulation layer in the light receiving area; and a light blocking pattern disposed between the first color filter and the second color filter.

The thin film encapsulation layer may include an opening exposing a portion of each of the cathode electrode of the light emitting element and the second electrode of the light receiving element between the light emitting area and the light receiving area; and wherein the light blocking pattern may fill the opening in an area between the light emitting area and the light receiving area.

The thin film encapsulation layer may include an opening exposing a portion of each of the cathode electrode of the light emitting element and the second electrode of the light receiving element between the light emitting area and the light receiving area, and wherein an air layer may be disposed within the opening.

The display device may further include a touch sensor disposed between the thin film encapsulation layer and the first and second color filters.

A display device includes a substrate; a sub-pixel including a pixel circuit including at least one transistor disposed on the substrate and a light emitting element electrically connected to the pixel circuit; and a photo-sensing pixel including a sensor circuit including at least one sensor transistor disposed on the substrate and a light receiving element electrically connected to the sensor circuit, wherein the sub-pixel includes a light emitting area from which light is emitted from the light emitting element, wherein the photo-sensing pixel includes a light receiving area, wherein the light emitting area and the light receiving area are spaced apart from each other on the substrate, wherein the light emitting area and the light receiving area each have a polygonal shape, and wherein a shape of the light emitting area is different from a shape of the light receiving area.

The light emitting area may have a hexagonal shape, and the light receiving area may have a quadrilateral shape.

The light receiving area may have a square shape.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 15 to 17 illustrate schematic cross-sectional views of a display device according to embodiments of the present invention.

DETAILED DESCRIPTION OF THE EMBODIMENTS

Figure 1:
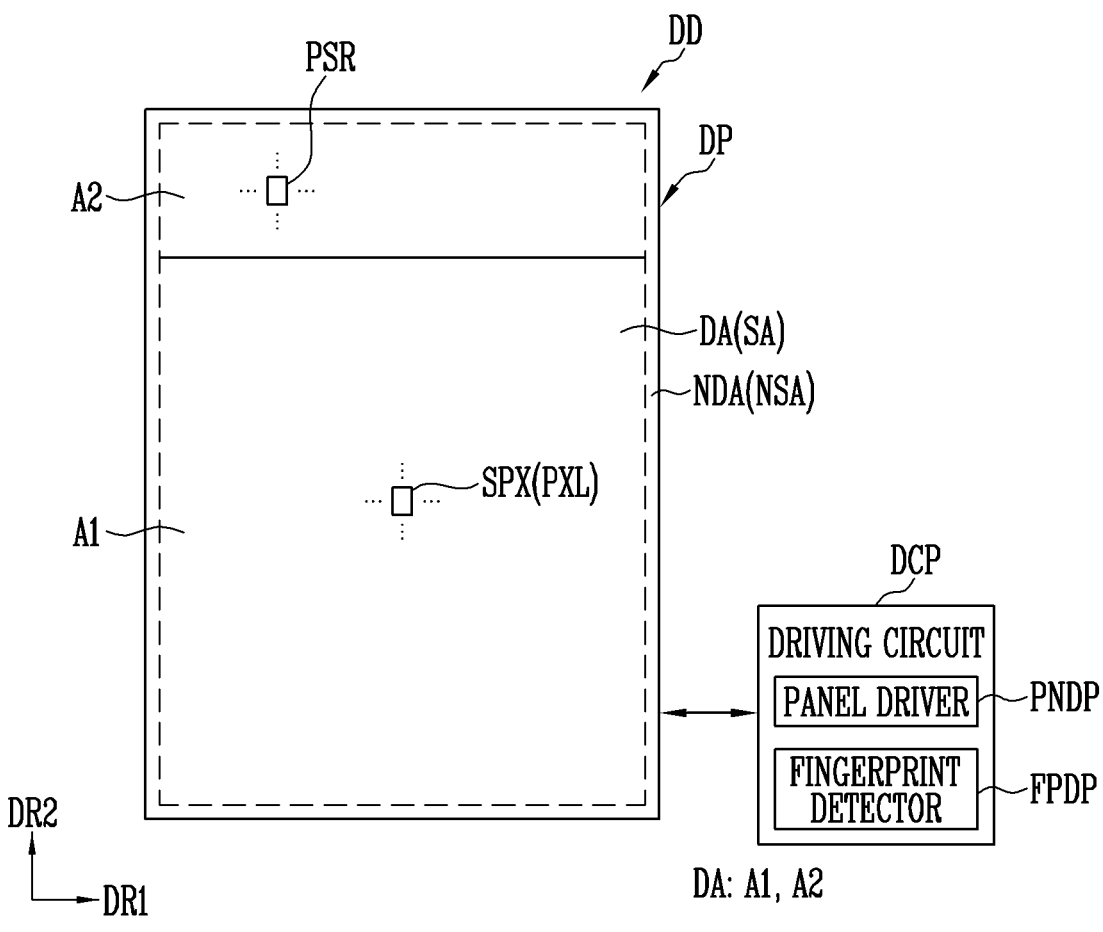
FIGS. 1 and 2 illustrate schematic top plan views of a display device according to embodiments of the present invention.

Like reference numerals may be used to designate like constituent elements in describing each drawing. In the accompanying drawings, the relative dimensions, relative dispositions, angles, etc., of the structure are intended to represent at least one embodiment of the present disclosure, drawn to scale, however, it is to be understood that many changes to these relative dimensions, relative dispositions, angles, etc., may be made within the scope of the present disclosure. Terms such as first, second, and the like may be used only to describe various constituent elements, and are not to be interpreted as limiting these constituent elements. The terms are used to differentiate one constituent element from other constituent elements. For example, a first constituent element could be termed a second constituent element, and similarly, a second constituent element could be termed as a first constituent element, without departing from the scope of the present invention. Singular forms are intended to include plural forms unless the context clearly indicates otherwise.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

It will be understood that when an element such as a layer, film, region, area, or substrate is referred to as being "on" another element, it can be directly on the other element or intervening elements may also be present. In addition, in present specification, when an element of a layer, film, region, area, plate, or the like is referred to as being formed "on" another element, the formed direction is not necessarily limited to an upper direction but includes a lateral or lower direction. When an element of a layer, film, region, area, plate, or the like is referred to as being "below" another element, it may be directly below the other element, or intervening elements may be present.

Hereinafter, an embodiment of the present invention will be described in detail with reference to the accompanying drawings. The same reference numerals may be used for the same constituent elements on the drawings.

Figures 2, 3:
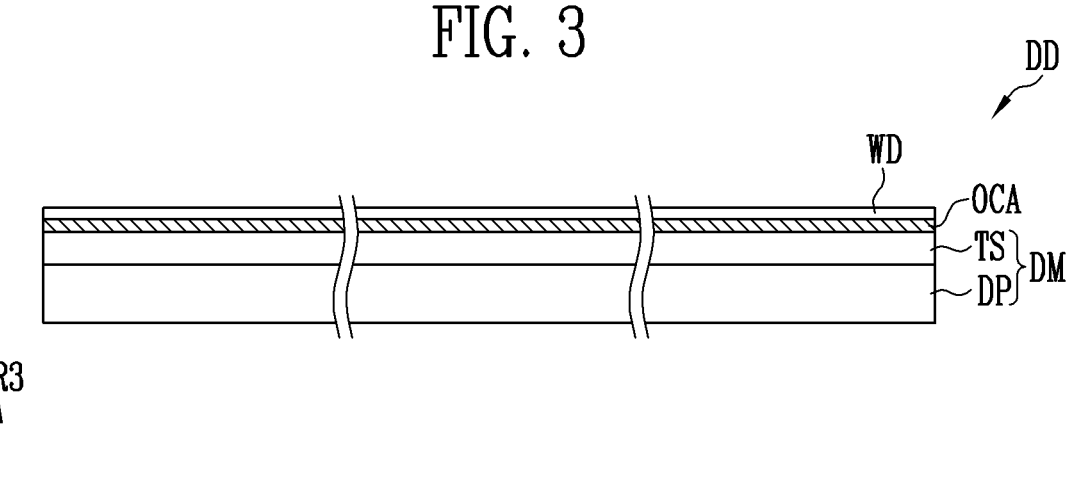
FIG. 3 illustrates a schematic cross-sectional view of a display device according to embodiments of the present invention.

FIGS. 1 and 2 illustrate schematic top plan views of a display device according to embodiments of the present invention. FIG. 1 and FIG. 2 illustrate a display panel DP included in a display device DD according to embodiments of the present invention, and a driving circuit DCP for driving the display panel DP.

FIG. 1 and FIG. 2 separately illustrate the display panel DP and the driving circuit DCP, but the embodiment of the present invention is not necessarily limited thereto. In some embodiments, all or a portion of the driving circuit DCP may be integrally implemented on the display panel DP.

Referring to FIG. 1 and FIG. 2, the display device DD may include the display panel DP and the driving circuit DCP for driving the display panel DP.

The display device DD may be provided in various shapes, and as an example, may be provided in a rectangular plate shape having two pairs of sides parallel to each other, but the embodiment of the present invention is not necessarily limited thereto. When the display device DD is provided in the rectangular plate shape, there may be a first pair of sides that is longer than a second pair of sides. FIG. 1 and FIG. 2 illustrate a case in which the display device DD has a rectangular shape having a pair of long sides and a pair of short sides for better understanding and ease of description, and an extending direction of the pair of long sides is illustrated as a second direction DR2 and an extending direction of the pair of short sides is illustrated as a first direction DR2. In some embodiments, in the display device DD provided in a shape of a rectangular plate, a corner portion at which one long side and one short side contact each other may have a round shape.

In the embodiment, at least a portion of the display device DD may be flexible, and the display device DD may be folded at the flexible portion.

The display device DD may be a flat panel display device, a flexible display device, a curved display device, a foldable display device, or a bendable display device. In addition, the display device DD may be applied to a transparent display device, a head-mounted display device, a wearable display device, and the like.

The display panel DP may include a display area DA and a non-display area NDA. Sub-pixels SPX (or pixels PXL) are provided in the display area DA, so that an image may be displayed, and the non-display area NDA may be disposed on at least one side of the display area DA. For example, the non-display area NDA may at least partially surround the display area DA.

A plurality of sub-pixels SPX may be provided in the display area DA. In some embodiments, each of the sub-pixels SPX may include at least one light emitting element. In some embodiments, the light emitting element may be a light emitting unit including an organic light emitting diode or ultra-small inorganic light emitting diodes having a size of a micro to nano scale range, but is not necessarily limited thereto. The display device DD may display an image on the display area DA by driving the sub-pixels SPX in response to inputted image data.

The non-display area NDA is an area surrounding at least one side of the display area DA, and it may be the remaining area except for the display area DA. In some embodiments, the non-display area NDA may include a wire area, a pad area, and/or various dummy areas.

In the embodiment, one area of the display area DA may be set as a sensing area SA capable of sensing a user's fingerprint or the like. For example, at least a portion of the display area DA may be the sensing area SA. The sensing area SA may include at least some of the sub-pixels SPX provided in the display area DA.

In the embodiment, only a portion of the display area DA may be set as the sensing area SA. However, the embodiment of the present invention is not necessarily limited thereto. For example, the entire display area DA may be set as the sensing area SA. When the entire display area DA is set as the sensing area SA, the non-display area NDA at least partially surrounding the display area DA may become a non-sensing area NSA. A plurality of photo-sensing pixels PSR (or photo sensors) may be disposed in the sensing area SA along with the plurality of sub-pixels SPX.

Each of the photo-sensing pixels PSR may include a light receiving element including a light receiving layer. In the display area DA, the light receiving layer of the light receiving element may be spaced apart from a light emitting layer of the light emitting element.

In some embodiments, the plurality of photo-sensing pixels PSR may be spaced apart from each other in the entire area of the display area DA. However, the present invention is not necessarily limited thereto. For example, as shown in FIG. 1, the display area DA may be partitioned into a first area A1 and a second area A2 in the second direction DR2, and the photo-sensing pixels PSR may be disposed only in the second area A2. In addition, as an example, the photo-sensing pixels PSR may be disposed in at least a portion of the non-display area NDA.

In some embodiments, the photo-sensing pixels PSR may sense that light emitted from a light source (for example, a light emitting element) is reflected by an external object (for example, a user's finger or the like). For example, a user's fingerprint may be sensed through each of the photo-sensing pixels PSR. Hereinafter, an embodiment will be described by using the photo-sensing pixels PSR used for fingerprint sensing as an example, but in various embodiments, the photo-sensing pixels PSR may sense various biometric information such as iris and veins. In addition, the photo-sensing pixels PSR may sense external light and may perform functions such as a gesture sensor, a motion sensor, a proximity sensor, an illuminance sensor, and an image sensor.

The driving circuit DCP may drive the display panel DP. For example, the driving circuit DCP may output a data signal corresponding to image data to the display panel DP or may output a driving signal for the photo-sensing pixels PSR, and may receive an electrical signal (for example, a sensing signal) received from the photo-sensing pixels PSR. The driving circuit DCP may detect a user's fingerprint by using the electrical signals.

In some embodiments, the driving circuit DCP may include a panel driver PNDP and a fingerprint detector FPDP (or a sensor driver). For better comprehension and ease of description, although the panel driver PNDP and the fingerprint detector FPDP are shown as separate components in FIG. 1 and FIG. 2, the embodiment of the present invention is not necessarily limited thereto. For example, at least a portion of the fingerprint detector FPDP may be integrated with the panel driver PNDP, or may operate in conjunction with the panel driver PNDP.

The panel driver PNDP may supply a data signal corresponding to an image data signal to the sub-pixels SPX while sequentially scanning the sub-pixels SPX of the display area DA. In this case, the display panel DP may display an image corresponding to the image data.

In some embodiments, the panel driver PNDP may supply a driving signal for fingerprint sensing to the sub-pixels SPX. Such the driving signal may be provided to the sub-pixels SPX such that the sub-pixels SPX emit light to operate as a light source for the photo-sensing pixels PSR. In addition, in some embodiments, the panel driver PNDP may supply the driving signal and/or other driving signal for fingerprint sensing to the photo-sensing pixels PSR. However, the embodiment of the present invention is not necessarily limited thereto, and the driving signals for fingerprint sensing may be provided by the fingerprint detector FPDP.

The fingerprint detector FPDP may detect biometric information such as a user's fingerprint based on a sensing signal received from the photo-sensing pixels PSR. In some embodiments, the fingerprint detector FPDP may supply the driving signals to the photo-sensing pixels PSR and/or the sub-pixels SPX.

FIG. 3 illustrates a schematic cross-sectional view of a display device according to embodiments of the present invention. For better comprehension and ease of description, in FIG. 3, a thickness direction of the display device DD is illustrated as a third direction DR3.

Referring to FIG. 3, the display device DD may include a display module DM and a window WD.

The display module DM may include a display panel DP and a touch sensor TS.

The touch sensor TS may be directly disposed on the display panel DP, or may be disposed on the display panel DP with a separate layer such as an adhesive layer or a substrate (or an insulation layer) interposed therebetween.

The display panel DP may display an image. As the display panel DP, a display panel capable of self-luminous, such as an organic light emitting display panel (OLED panel), may be used. However, the embodiment of the present invention is not necessarily limited thereto, and for example, as the display panel DP, a non-light emitting display panel such as a liquid crystal display panel (LCD panel), an electro-phoretic display panel (EPD panel), and an electro-wetting display panel (EWD panel) may be used. When the non-light emitting display panel is used as the display panel DP, the display device DD may be provided with a backlight unit that supplies light to the display panel DP.

The touch sensor TS may be disposed on a surface on which an image of the display panel DP is emitted to receive a user's touch input. The touch sensor TS may recognize a touch event of the display device DD through a user's hand or a separate input members. The touch sensor TS may recognize a touch event in a capacitance method. For example, the touch sensor TS may sense the touch input by using a mutual capacitance method, or may sense the touch input by using a self-capacitance method.

The window WD for protecting an exposed surface of the display module DM may be provided on the display module DM. The window WD may protect the display module DM from external impact, and may provide an input surface and/or a display surface to a user. The window WD may be combined with the display module DM by using an optically clear adhesive member OCA.

The window WD may have a multi-layered structure selected from a glass substrate, a plastic film, and a plastic substrate. Such a multi-layered structure may be formed through a continuous process or an adhesive process using an adhesive layer. The window WD may be entirely or partially flexible.

Figure 4:
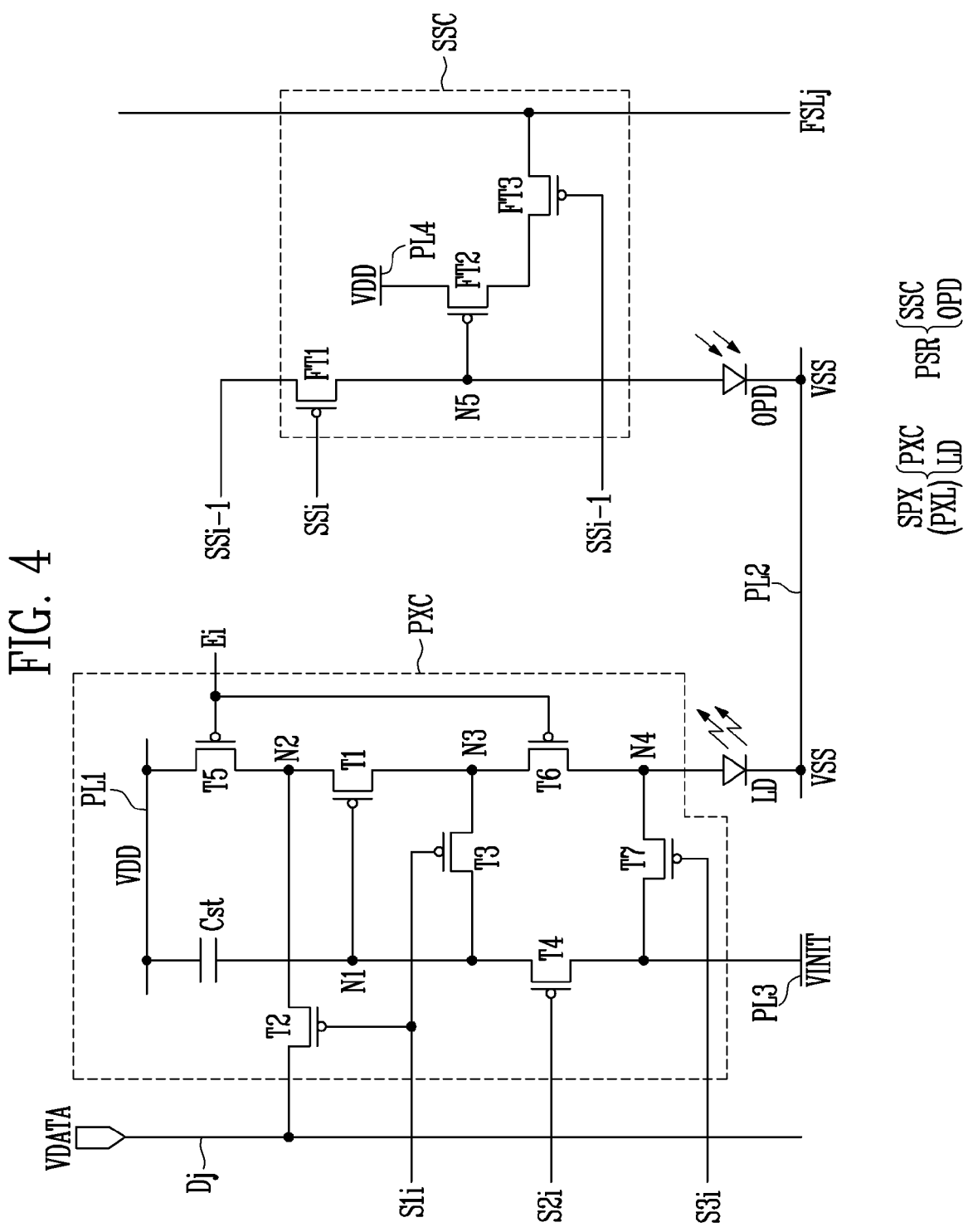
FIG. 4 illustrates a circuit diagram of a sub-pixel and a photo-sensing pixel included in the display device of FIG. 2.

FIG. 4 illustrates a circuit diagram of a sub-pixel and a photo-sensing pixel included in the display device of FIG. 2.

In FIG. 4, for better comprehension and ease of description, a sub-pixel SPX (or a pixel PXL) disposed in an i-th pixel row (or an i-th horizontal line) and connected to a j-th data line Dj and a photo-sensing pixel PSR disposed in the i-th pixel row and connected to a j-th fingerprint sensing line FSLj (or a readout line) are illustrated (wherein i and j are positive integers).

Referring to FIG. 1 to FIG. 4, the sub-pixel SPX may include a pixel circuit PXC and a light emitting element LD connected thereto, and the photo-sensing pixel PSR may include a sensor circuit SSC and a light receiving element OPD connected thereto.

One electrode (or an anode electrode) of the light emitting element LD may be connected to a fourth node N4, and the other electrode (or a cathode electrode) thereof may be connected to a second driving power source VSS. The light emitting element LD may generate light of a predetermined luminance in response to an amount of current (a driving current) supplied from the pixel circuit PXC.

In some embodiments, the light emitting element LD may be an organic light emitting diode including an organic light emitting layer. However, the embodiment of the present invention is not necessarily limited thereto, and the light emitting element LD may be an inorganic light emitting element made of an inorganic material or a light emitting element made of a composite of an inorganic material and an organic material.

In some embodiments, the light receiving element OPD may be an organic photodiode. One electrode (or a first sensor electrode) of the light receiving element OPD may be connected to a fifth node N5, and the other electrode (or a second sensor electrode) thereof may be connected to the second driving power source VSS. The light receiving element OPD may generate a carrier including free electrons and holes based on an intensity of light incident to a light receiving layer, and may generate a current (optical current) by movement of the carrier.

The pixel circuit PXC may include a first transistor T1, a second transistor T2, a storage capacitor Cst, and a light emitting element LD. In addition, the pixel circuit PXC may further include third to seventh transistors T3 to T7.

A gate electrode of the first transistor T1 (or driving transistor) may be connected to a first node N1, a first electrode of the first transistor T1 may be connected to a second node N2, and a second electrode of the first transistor T1 may be connected to a third node N3.

The first transistor T1 may control an amount of current flowing from a first driving power source VDD to the second driving power source VSS via the light emitting element LD in response to a voltage of the first node N1. Thus, the first driving power source VDD may be set to a higher voltage than that of the second driving power source VSS.

The second transistor T2 (or switching transistor) may be connected between a j-th data line Dj (hereinafter referred to as a 'data line') connected to the pixel PXL and the second node N2. A gate electrode of the second transistor T2 may be connected to an i-th first scan line S1*i* (hereinafter referred to as a 'first scan line') connected to the pixel PXL. The second transistor T2 may be turned on when a first scan signal is supplied to the first scan line S1*i* to electrically connect the data line Dj and the second node N2.

The third transistor T3 (or compensation transistor) may be connected between the second electrode (for example, the third node N3) and the gate electrode (for example, the first node N1) of the first transistor T1. A gate electrode of the third transistor T3 may be connected to the first scan line S1*i*. The third transistor T3 may be turned on when the first scan signal is supplied to the first scan line S1*i* to electrically connect the second electrode and the gate electrode of the first transistor T1 (or the first node N1 and the third node N3). For example, the timing at which the second electrode of the first transistor T1 and the gate electrode of the first transistor T1 are connected may be controlled by the first scan signal. When the third transistor T3 is turned on, the first transistor T1 may have a diode-connected structure.

The fourth transistor T4 (or first initialization transistor) may be connected between the first node N1 (or the gate electrode of the first transistor T1) and a third power line PL3 to which an initialization voltage VINIT is applied. A gate electrode of the fourth transistor T4 may be connected to an i-th second scan line S2*i* (hereinafter referred to as a 'second scan line'). The fourth transistor T4 may be turned on in response to a second scan signal supplied to the second scan line S2i to supply the initialization voltage VINIT to the first node N1. In this case, the initialization voltage VINIT may be set to a voltage lower than a data voltage VDATA supplied to the data line Dj. Accordingly, when the fourth transistor T4 is turned on, the gate voltage of the first transistor T1 (or the first node N1) may be initialized to the initialization voltage VINIT.

The fifth transistor T5 (or first light emitting control transistor) may be connected between a first power line PL1 (or a first driving voltage line) and the second node N2. A gate electrode of the fifth transistor T5 may be connected to an i-th light emitting control line Ei, (hereinafter, referred to as a light emitting control line). The fifth transistor T5 is turned on when a light emitting control signal is supplied to the light emitting control line Ei, and is turned off in other cases.

The sixth transistor T6 (or second light emitting control transistor) may be connected between the second electrode (for example, the third node N3) of the first transistor T1 and the fourth node N4. A gate electrode of the sixth transistor T6 may be connected to the light emitting control line Ei. The sixth transistor T6 may be controlled in a manner substantially equivalent to the way that the fifth transistor T5 is controlled.

The fifth transistor T5 and the sixth transistor T6 are turned on in response to a light emitting control signal supplied through the light emitting control line Ei, and may form a movement path of the driving current between the first power line PL1 and the fourth node N4 (or between the first power line PL1 and the second power line PL2).

In FIG. 4, the fifth transistor T5 and the sixth transistor T6 are illustrated as being connected to the same light emitting control line Ei, but this is an example, and the fifth transistor T5 and the sixth transistor T6 may be respectively connected to separate light emitting control lines to which different light emitting control signals are supplied.

The seventh transistor T7 (or second initialization transistor) may be connected between the fourth node N4 and the third power line PL3. A gate electrode of the seventh transistor T7 may be connected to an i-th third scan line S3i (hereinafter referred to as a 'third scan line'). The seventh transistor T7 may be turned on when a third scan signal is supplied to the third scan line S3i to supply the initialization voltage VINIT to the fourth node N4.

The storage capacitor Cst may be connected between the first power line PL1 and the first node N1. The storage capacitor Cst may store a voltage difference between a voltage of the first driving power source VDD by the first power line PL1 and a voltage obtained by subtracting an absolute threshold voltage of the first transistor T1 from a data voltage applied to the first node N1.

In the embodiment, after the second scan signal is supplied, the first scan signal may be supplied. For example, the second scan signal and the first scan signal may be supplied with a difference of one horizontal period.

In the embodiment, the third scan signal may be supplied simultaneously with the first scan signal. However, the present invention is not necessarily limited thereto, and the first scan signal may be supplied after the third scan signal is supplied. For example, a supply interval between the third scan signal and the first scan signal may be one horizontal period. Alternatively, the third scan signal may be supplied after the first scan signal is supplied.

The sensor circuit SSC may include a first sensor transistor FT1, a second sensor transistor FT2, and a third sensor transistor FT3.

The second sensor transistor FT2 and the third sensor transistor FT3 may be connected in series between the sensing power line PL4 (or the fourth power line) and the j-th fingerprint sensing line FSLj (hereinafter referred to as a fingerprint sensing line).

The first sensor transistor FT1 may be connected between an (i−1)-th sensing scan line SSi−1 (hereinafter referred to as a previous sensing scan line) and the fifth node N5 (or a first electrode of the light receiving element OPD). A gate electrode of the first sensor transistor FT1 may be connected to an i-th sensing scan line SSi (hereinafter referred to as a sensing scan line). The first sensor transistor FT1 may be turned on by a sensing scan signal supplied to the sensing scan line SSi to supply a voltage supplied to the previous sensing scan line SSi-1 to the fifth node N5. The first sensor transistor FT1 may be used for voltage reset (or initialization) of the fifth node N5.

A gate electrode of the second sensor transistor FT2 may be connected to the fifth node N5. The second sensor transistor FT2 may generate a sensing current flowing from the sensing power line PL4 to the fingerprint sensing line FSLj based on a voltage of the fifth node N5 by a light current generated from the light receiving element OPD.

In the embodiment, a gate electrode of the third sensor transistor FT3 may be connected to the previous sensing scan line SSi−1. The third sensor transistor FT3 may be turned on when the sensing scan signal is supplied to the previous sensing scan line SSi−1 to electrically connect the second sensor transistor FT2 and the fingerprint sensing line FSLj. Then, a sensing signal (sensing current) may be supplied to the fingerprint detector FPDP through the fingerprint sensing line FSLj.

In some embodiments, the first to seventh transistors T1 to T7 included in the pixel circuit PXC and the first to third sensor transistors FT1 to FT3 included in the sensor circuit SSC may be P-type transistors (for example, PMOS transistors), but the embodiment of the present invention is not necessarily limited thereto. For example, at least one of the first to seventh transistors T1 to T7 and the first to third sensor transistors FT1 to FT3 may be implemented as an N-type transistor (for example, an NMOS transistor). When the first to seventh transistors T1 to T7 and the first to third sensor transistors FT1 to FT3 are N-type transistors, positions of a source area (or source electrode) and a drain area (or drain electrode) may be reversely changed.

Figure 5:
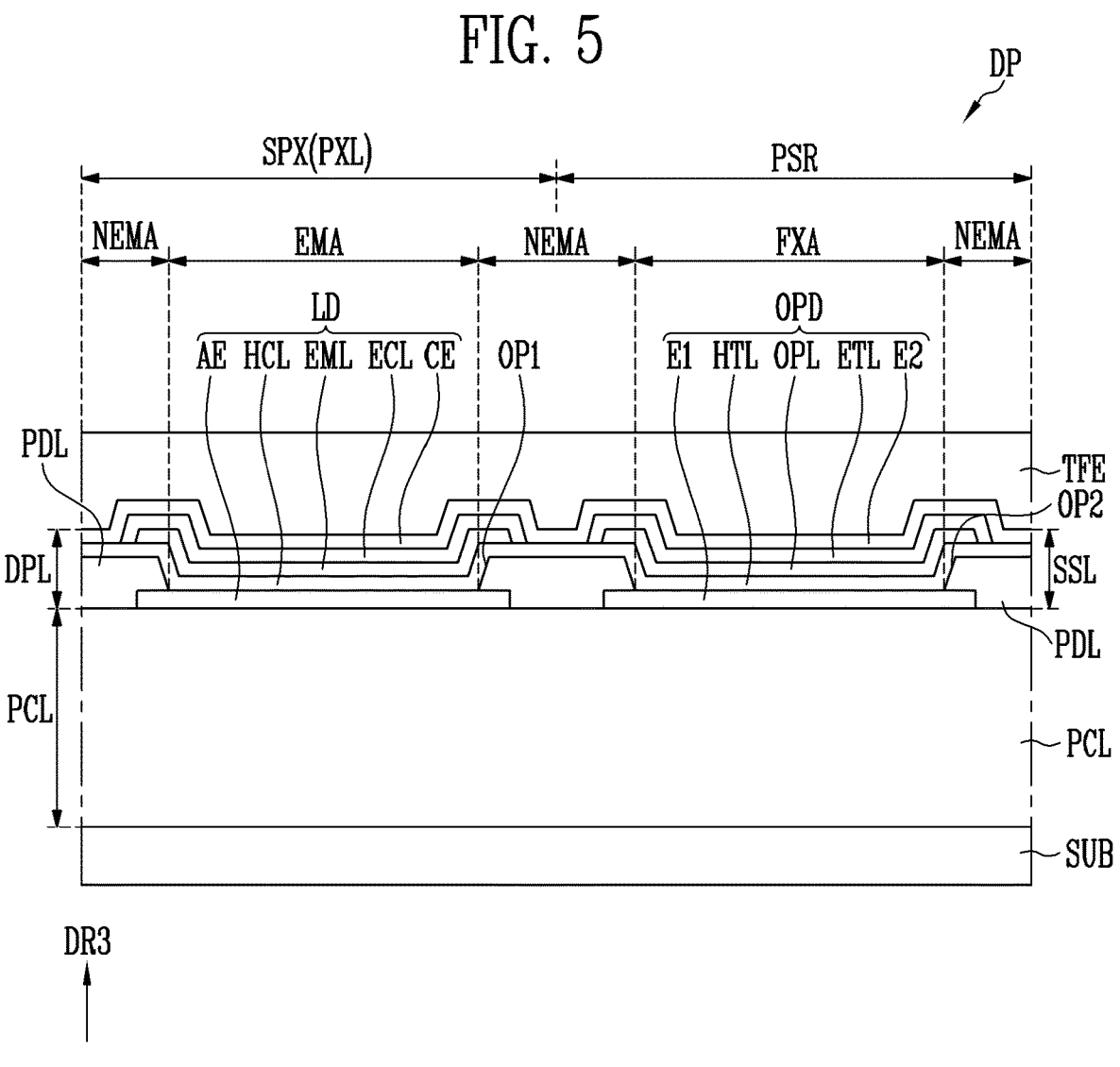
FIG. 5 illustrates an enlarged cross-sectional view of a portion of a display panel included in the display device of FIG. 3.

FIG. 5 illustrates an enlarged cross-sectional view of a portion of a display panel included in the display device of FIG. 3.

Referring to FIG. 1 to FIG. 5, the display panel DP may include one or more sub-pixels SPX (or pixels PXL) and one or more photo-sensing pixels PSR.

The sub-pixel SPX may be disposed within a pixel area included in the display area DA. The pixel area may include a light emitting area EMA and a non-light emitting area NEMA adjacent to the light emitting area EMA. The photo-sensing pixel PSR may include a light receiving area FXA and a non-light emitting area NEMA adjacent to the light receiving area FXA.

The sub-pixel SPX may include a pixel circuit layer PCL, a display element layer DPL, and a thin film encapsulation layer TFE that are sequentially disposed on a substrate SUB. The photo-sensing pixel PSR may include a substrate, and a pixel circuit layer PCL, a sensor layer SSL, and a thin film encapsulation layer TFE that are sequentially disposed on the substrate SUB.

The pixel circuit layer PCL of the sub-pixel SPX may include a pixel circuit PXC provided on the substrate SUB and signal lines connected to a pixel circuit PXC. In addition, the pixel circuit layer PCL of the sub-pixel SPX may include one or more insulation layers disposed between components included in the pixel circuit PXC.

The display element layer DPL may be formed on the pixel circuit layer PCL of the sub-pixel SPX. The display element layer DPL may include the light emitting element LD that emits light. The light emitting element LD may include an anode electrode AE, a light emitting layer EML, and a cathode electrode CE. The anode electrode AE may be electrically connected to the pixel circuit PXC.

The display element layer DPL of the sub-pixel SPX may include a pixel defining film PDL including a first opening OP1 exposing a portion of the anode electrode AE. The pixel defining film PDL may be provided on the anode electrode AE and the pixel circuit layer PCL. In addition, the display element layer DPL may include a hole control layer HCL and an electron control layer ECL that are commonly provided in the light emitting area EMA and the non-light emitting area NEMA. The hole control layer HCL may include a hole transport layer, and may further include a hole injection layer. The hole control layer HCL may be provided on the anode electrode AE exposed by the first opening OP1 of the pixel defining film PDL and the pixel defining film PDL. The light emitting layer EML may be provided on the hole control layer HCL of the light emitting area EMA. The electron control layer ECL may be disposed on the light emitting layer EML. The electron control layer ECL may include an electron transport layer, and may further include an electron injection layer. The cathode electrode CE may be provided on the electron control layer ECL.

The pixel circuit layer PCL of the photo-sensing pixel PSR may include a sensor circuit SSC provided on the substrate SUB and signal lines connected to a sensor circuit SSC. In addition, the pixel circuit layer PCL of the photo-sensing pixel PSR may include one or more insulation layers disposed between components included in the sensor circuit SSC.

A sensor layer SSL may be formed on the pixel circuit layer PCL of the photo-sensing pixel PSR. The sensor layer SSL may include a light receiving element OPD that receives light. The light receiving element OPD may include a first electrode E1, a light receiving layer OPL, and a second electrode E2. The first electrode E1 may be electrically connected to the sensor circuit SSC.

The sensor layer SSL of the photo-sensing pixel PSR may include a pixel defining film PDL including a second opening OP2 exposing a portion of the first electrode E1. The pixel defining film PDL may be the pixel defining film PDL of the sub-pixel SPX. The pixel defining film PDL may be provided on the first electrode E1 and the pixel circuit layer PCL. In addition, the sensor layer SSL may include a hole transport layer HTL and an electron transport layer ETL that are commonly provided in the light receiving area FXA and the non-light emitting area NEMA. The hole transport layer HTL may be formed of the same material as the hole control layer HCL of the sub-pixel SPX by the same process. The hole transport layer HTL may be disposed between the first electrode E1 and the light receiving layer OPL. The light receiving layer OPL may be disposed on the hole transport layer HTL of the light receiving area FXA. The electron transport layer ETL may be formed of the same material as the electron control layer ECL of the sub-pixel SPX by the same process. The second electrode E2 may be provided on the electron control layer ECL.

In some embodiments, the cathode electrode CE of the sub-pixel SPX and the second electrode E2 of the photo-sensing pixel PSR may be formed of the same material as each other by the same process. In addition, the cathode electrode CE and the second electrode E2 may be electrically connected to the second power line PL2 that transmits the voltage of the second driving power source VSS as shown in FIG. 4.

The thin film encapsulation layer TFE may be provided and/or formed on the display element layer DPL of the sub-pixel SPX and the sensor layer SSL of the photo-sensing pixel PSR.

The thin film encapsulation layer TFE may be formed as either a single layer or it may be formed as a multi-layer. The thin film encapsulation layer TFE may include a plurality of insulation layers covering the light emitting element LD and the light receiving element OPD. For example, the thin film encapsulation layer TFE may include at least one inorganic film and at least one organic film. For example, the thin film encapsulation layer TFE may have a structure in which an inorganic film and an organic film are alternately stacked. In some embodiments, the thin film encapsulation layer TFE may be an encapsulation substrate that is disposed on the light emitting element LD and the light receiving element OPD and is bonded to the substrate SUB through a sealant.

Figure 6:
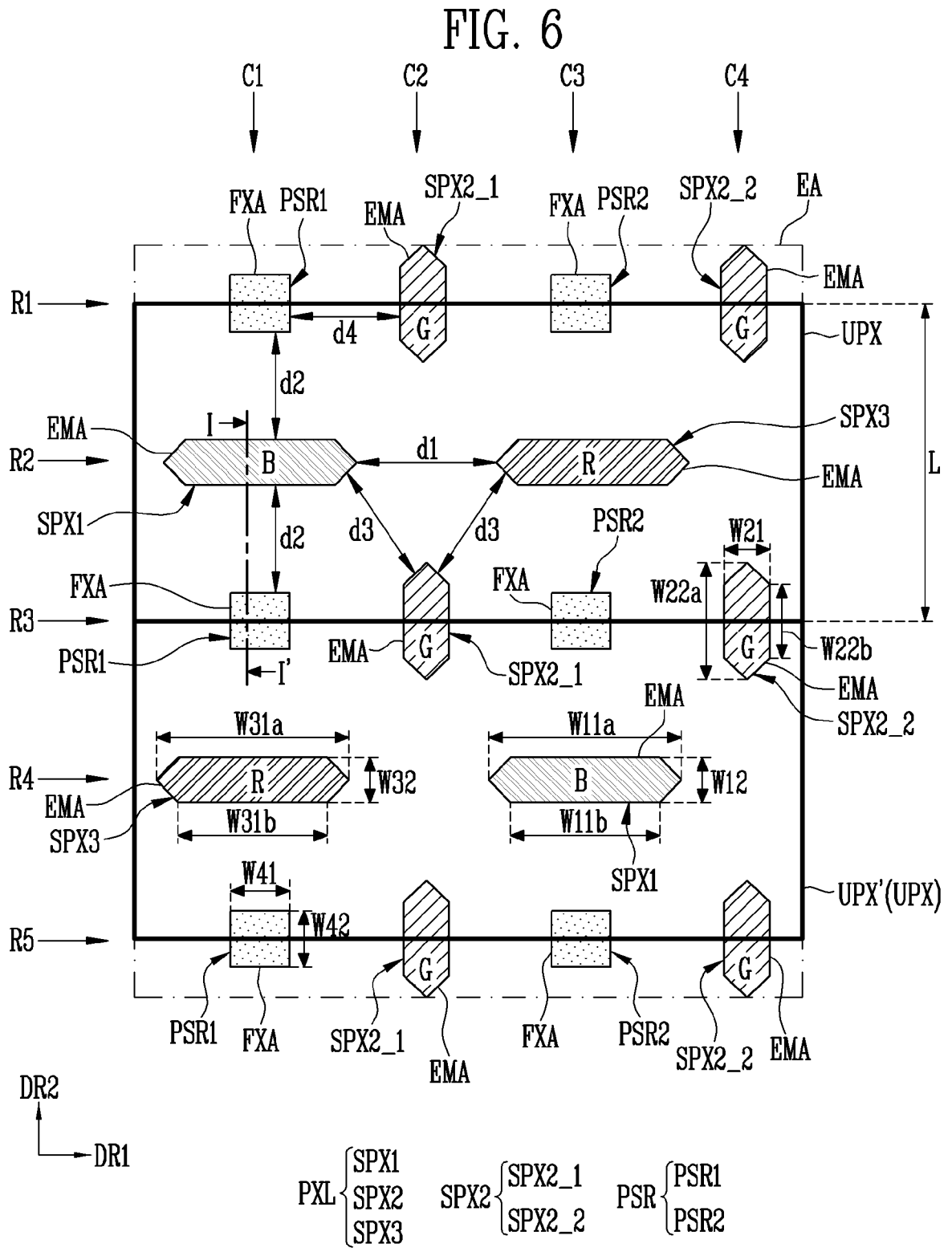
FIG. 6 illustrates an enlarged view of a portion 'EA' of the display device of FIG. 2.

FIG. 6 illustrates an enlarged view of a portion 'EA' of the display device of FIG. 2.

Hereinafter, a first sub-pixel SPX1, a second sub-pixel SPX2, and a third sub-pixel SPX3 indicate the light emitting areas EMA of respective sub-pixels, and the light emitting area EMA may be defined by a first opening (for example, the first opening OP1 of FIG. 5) of a pixel defining film (for example, the pixel defining film PDL of FIG. 5). In addition, the photo-sensing pixel PSR indicates the light receiving area FXA of the photo-sensing pixel PSR, and the light receiving area FXA may be defined by the second opening (for example, the second opening OP2 of FIG. 5) of the pixel defining film (for example, the pixel defining film PDL of FIG. 5).

In FIG. 6, for better comprehension and ease of description, a horizontal direction in a plan view is illustrated as the first direction DR1, and a vertical direction in a plan view is illustrated as the second direction DR2.

Referring to FIG. 2, FIG. 5, and FIG. 6, the sub-pixels SPX1, SPX2, and SPX3 (or the pixels PXL) disposed in the display area DA may be spaced apart from each other. The first sub-pixel SPX1 (or the first pixel), the second sub-pixel SPX2 (or the second pixel), and the third sub-pixel SPX3 (or the third pixel) may emit (implement) light of different colors. For example, the first sub-pixel SPX1 may emit blue light (B), the second sub-pixel SPX2 may emit green light (G), and the third sub-pixel SPX3 may emit red light (R).

In a first row R1, the photo-sensing pixel PSR and the second sub-pixel SPX2 may be alternately disposed. In a second row R2 adjacent to the first row R1 in the second direction DR2, the first sub-pixel SPX1 and the third sub-pixel SPX3 may be alternately disposed. In a third row R3 adjacent to the second row R2 in the second direction DR2, the photo-sensing pixel PSR and the second sub-pixel SPX2 may be alternately disposed. In a fourth row R4 adjacent to the third row R3 in the second direction DR2, the third sub-pixel SPX3 and the first sub-pixel SPX1 may be alternately disposed. In a fifth row R5 adjacent to the fourth row R4 in the second direction DR2, the photo-sensing pixel PSR and the second sub-pixel SPX2 may be alternately disposed.

The second sub-pixels SPX2 disposed in the first row R1 may be alternately disposed with the first sub-pixel SPX1 and third sub-pixel SPX3 disposed in the second row R2. The second sub-pixels SPX2 disposed in the third row R3 may be alternately disposed with the first sub-pixel SPX1 and third sub-pixel SPX3 disposed in the second row R2. In addition, the second sub-pixels SPX2 disposed in the third row R3 may be alternately disposed with the third sub-pixel SPX3 and the first sub-pixel SPX1 disposed in the fourth row R4. The second sub-pixels SPX2 disposed in the fifth row R5 may be alternately disposed with the third sub-pixel SPX3 and the first sub-pixel SPX1 disposed in the fourth row R4.

The photo-sensing pixel PSR disposed in the first row R1, the first sub-pixel SPX1 disposed in the second row R2, the photo-sensing pixel PSR disposed in the third row R3, the third sub-pixel SPX3 disposed in the fourth row R4, and the photo-sensing pixel PSR disposed in the fifth row R5 may be disposed in the same column (for example, a first column C1).

In a second column C2 adjacent to the first column C1 in the first direction DR1, the second sub-pixel SPX2 in the first row R1, the second sub-pixel SPX2 in the third row R3, and the second sub-pixel SPX2 in the fifth row R5 may be disposed.

In a third column C3 adjacent to the second column C2 in the first direction DR1, the photo-sensing pixel PSR in the first row R1, the third sub-pixel SPX3 in the second row R2, the photo-sensing pixel PSR in the third row R3, the first sub-pixel SPX1 in the fourth row R4, and the photo-sensing pixel PSR in the fifth row R5 may be disposed.

In a fourth column C4 adjacent to the third column C3 in the first direction DR1, the second sub-pixel SPX2 in the first row R1, the second sub-pixel SPX2 in the third row R3, and the second sub-pixel SPX2 in the fifth row R5 may be disposed.

Hereinafter, for better comprehension and ease of description, the second sub-pixels SPX2 disposed in the second column C2 are referred to as (2-1)-th sub-pixels SPX2_1, and the second sub-pixels SPX2 disposed in the fourth column C4 are referred to as (2-2)-th sub-pixels SPX2_2.

A plurality of unit pixels UPX that are repeatedly arranged may be disposed in the display area DA.

Each of the unit pixels UPX may include predetermined sub-pixels SPX1, SPX2, and SPX3 and predetermined photo-sensing pixels PSR. For example, one unit pixel UPX may include the first and third sub-pixels SPX1 and SPX3 disposed in the same row (for example, the second row R2) and adjacent in the first direction DR1; two photo-sensing pixels PSR (hereinafter referred to as first photo-sensing pixels PSR1) disposed in the same column as the first sub-pixel SPX1 (for example, the first column C1); two (2-1)-th sub-pixels SPX2_1 disposed in the same row as the first photo-sensing pixels PSR1 (for example, the first and third rows R1 and R3) and disposed in a column that is adjacent thereto (for example, the second column C2); two photo-sensing pixels PSR (hereinafter, referred to as second photo-sensing pixels PSR2) disposed in the same column as the third sub-pixel SPX3 (for example, the third column C3); and two (2-2)-th sub-pixels SPX2_2 disposed in the same row as the second photo-sensing pixels PSR2 and disposed in a column that is adjacent thereto (for example, the fourth column C4). The first photo-sensing pixels PSR1 may face each other in the corresponding unit pixel UPX with the first sub-pixel SPX1 interposed therebetween, and the second photo-sensing pixels PSR2 may face each other in the corresponding unit pixel UPX with the third sub-pixel SPX3 interposed therebetween.

One unit pixel UPX and an adjacent unit pixel UPX' adjacent to one unit pixel UPX in the second direction DR2 may share one first photo-sensing pixel PSR1, one second photo-sensing pixel PSR2, one (2-1)-th sub-pixel SPX2_1, and one (2-2)-th sub-pixel SPX2_2.

Each of one first sub-pixel SPX1, a plurality of the second sub-pixels SPX2, and one third sub-pixel SPX3 included in one unit pixel UPX may include the light emitting area EMA. Each of the first photo-sensing pixels PSR1 and the second photo-sensing pixels PSR2 included in the corresponding unit pixel UPX may include the light receiving area FXA.

Components disposed in one unit pixel UPX may be spaced apart from each other by a predetermined distance.

In one unit pixel UPX, the first sub-pixel SPX1 and the third sub-pixel SPX3 may be spaced apart from each other in the first direction DR1 by a first distance d1. In the corresponding unit pixel UPX, the first sub-pixel SPX1 and each of the first photo-sensing pixels PSR1 may be spaced apart from each other in the second direction DR2 by a second distance d2. Here, the first distance d1 and the second distance d2 may be different from each other. For example, the first distance d1 may be greater than the second distance d2. For example, the first distance d1 between the first sub-pixel SPX1 and the third sub-pixel SPX3 may be greater than the second distance d2 between the first sub-pixel SPX1 and each of the first photo-sensing pixels PSR1. For example, the first distance d1 and the second distance d2 may be designed to be greater than or equal to the minimum CD width (for example, 16.5 μm) required for the display device DD (for example, the first distance d1 is designed to be 16.5 μm and the second distance d2 is designed to be 18.3 μm), but the first distance d1 and the second distance d2 are not necessarily limited thereto. For example, the first distance d1 and the second distance d2 may be determined according to the resolution of the display device DD. The above-described minimum CD width may mean a minimum distance between sub-pixels within a range in which light (for example, blue light (B)) emitted from each sub-pixel (for example, the first sub-pixel SPX1) and light (for example, red light (R)) emitted from an adjacent sub-pixel (for example, the third sub-pixel SPX3) adjacent to the corresponding sub-pixel do not affect each other.

The first sub-pixel SPX1 and each of the second sub-pixels SPX2 disposed in different rows within one unit pixel UPX may be spaced apart by a third distance d3 in an oblique direction inclined with respect to the first direction DR1. In addition, the third sub-pixel SPX3 and each of the second sub-pixels SPX2 disposed in different rows within one unit pixel UPX may be spaced apart by the third distance d3 in an oblique direction inclined with respect to the first direction DR1. The third distance d3 may be different from each of the first and second distances d1 and d2, but the third distance d3 is not necessarily limited thereto, and for example, the third distance d3 may be the same as the first distance d1 or the same as the second distance d2. The third distance d3 may be designed to be 20 μm or less, but is not necessarily limited thereto. The third distance d3 may be determined according to the resolution of the display device DD.

Each photo-sensing pixel PSR and each second sub-pixel SPX2 disposed in the same row within one unit pixel (UPX) may be spaced apart from each other in the first direction DR1 by a fourth distance d4. The fourth distance d4 may be the same as or different from the first to third distances d1 to d3. The fourth distance d4 may be designed to be 16.5 μm or more, but is not necessarily limited thereto. The fourth distance d4 may be determined according to the resolution of the display device DD.

In some embodiments, each of the sub-pixels SPX1, SPX2, and SPX3 included in each unit pixel UPX may have a polygonal planar light emitting area EMA defined (or partitioned) by the pixel defining film PDL.

In the embodiment, each of the sub-pixels SPX1, SPX2, and SPX3 included in each unit pixel UPX may have a hexagonal planar light emitting area EMA.

For example, among the sub-pixels SPX1, SPX2, and SPX3 included in one unit pixel UPX, the first sub-pixel SPX1 and the third sub-pixel SPX3 may respectively have a hexagonal planar light emitting area EMA extending in the first direction DR1. As an example, as shown in FIG. 6, horizontal widths W11a and W11b may be defined along the first direction DR1 with respect to the first sub-pixel SPX1, a vertical width W12 may be defined along the second direction DR2 with respect to the first sub-pixel SPX1, wherein the horizontal widths W11a and W11b of the first sub-pixel SPX1 may be larger than the vertical width W12 thereof, respectively. As an example, as shown in FIG. 6, horizontal widths W31a and W31b may be defined along the first direction DR1 with respect to the third sub-pixel SPX3, a vertical width W32 may be defined along the second direction DR2 with respect to the third sub-pixel SPX3, wherein the horizontal widths W31a and W31b of the third sub-pixel SPX3 may be larger than the vertical width W32 thereof, respectively.

In addition, among the sub-pixels SPX1, SPX2, and SPX3 included in one unit pixel UPX, the second sub-pixel SPX2 may have a hexagonal planar light emitting area EMA extending in the second direction DR2. As an example, as shown in FIG. 6, a horizontal width W21 may be defined along the first direction DR1 with respect to the second sub-pixel SPX2, vertical widths W22a and W22b may be defined along the second direction DR2 with respect to the second sub-pixel SPX2, wherein the vertical widths W22a and W22b of the second sub-pixel SPX2 may be larger than the horizontal width W21 thereof, respectively.

In some embodiments, each of the photo-sensing pixels PSR is defined (or partitioned) by the pixel defining film PDL, and may have a polygonal (for example, quadrilateral) planar light receiving area FXA having a shape different from that of each of the sub-pixels SPX1, SPX2, and SPX3. For example, each of the photo-sensing pixels PSR included in the corresponding unit pixel UPX may have a light receiving area FXA having a square planar shape having the same horizontal width W41 and vertical width W42.

The light emitting area EMA of the first sub-pixel SPX1 may be an area in which blue light (B) is emitted, the light emitting area EMA of each of the second sub-pixels SPX2 may be an area in which green light (G) is emitted, and the light emitting area EMA of the third sub-pixel SPX3 may be an area in which red light (R) is emitted. The light receiving area FXA of each of the photo-sensing pixels PSR may be an area receiving the lights (R), (G), and (B) emitted from the first to third sub-pixels SPX1, SPX2, and SPX3.

In the above-described embodiment, a length L of one unit pixel UPX in the second direction DR2 may be determined according to the resolution of the display device DD. When the length L of one unit pixel UPX is determined, an area (for example, a hexagonal area calculated according to the horizontal width W21 and the vertical widths W22a and W22b) of the second sub-pixel SPX2 that finally emits the green light (G) according to a predetermined ratio of the red light (R), the green light (G), and the blue light (B) in the unit pixel UPX may be determined. For example, when an area (or size) of the light emitting area EMA of the second sub-pixel SPX2 is determined, an area (or size) of the light emitting area EMA of each of the first and third sub-pixels SPX1 and SPX3 may be determined. For example, in the corresponding unit pixel UPX, the area of each of the first to third sub-pixels SPX1, SPX2, and SPX3 may be determined to have a light emitting area EMA having a polygonal (for example, hexagonal) planar shape. This is to dispose one or more photo-sensing pixel PSR including the light-receiving element OPD in the corresponding unit pixel UPX.

Generally, in a case of a display device including a photo sensor attached to a rear surface of a substrate, since a path of light emitted from the light emitting element and reflected by the user's finger and then incident on the photo sensor is long, the sensing ability of the photo sensor may be reduced, and as the photo sensor is attached to the rear surface of the substrate, an overall thickness of the display device may be increased.

Here, in order to realize a slimmer display device and prevent loss of light traveling to the photo sensor, in the above-described embodiment, the photo-sensing pixel PSR including the light-receiving element OPD may be disposed adjacent to the sub-pixels SPX1, SPX2, and SPX3 in one unit pixel UPX.

In this case, in order to increase the amount of light incident to the light receiving element OPD by securing the area of the photo-sensing pixel PSR (or the light receiving area FXA) disposed within one unit pixel UPX, in the case of the display device DD according to the embodiments of the present invention, the pixel defining film PDL may be designed such that each of the sub-pixels SPX1, SPX2, and SPX3 disposed in the corresponding unit pixel UPX includes the light emitting area EMA having a polygonal (for example, hexagonal) planar shape extending along one direction (for example, the first direction DR1 or the second direction DR2) and the photo-sensing pixel PSR includes the light receiving area FXA having a quadrilateral (for example, square) planar shape. Particularly, when each of the sub-pixels SPX1, SPX2, and SPX3 in one unit pixel UPX includes the light emitting area EMA having the polygonal planar shape extending along the one direction, an area occupied by the photo-sensing pixel PSR within the corresponding unit pixel UPX is further secured, so that installation restrictions on the photo-sensing pixel PSR may be reduced according to the resolution of the display device DD.

Accordingly, in the above-described embodiment, by designing the light emitting area EMA of each of the sub-pixels SPX1, SPX2, and SPX3 disposed within each unit pixel UPX to have the polygonal (for example, hexagonal) planar shape extending along the one direction, and by designing the light receiving area FXA of one or more photo-sensing pixel PSR within the corresponding unit pixel UPX to have the quadrilateral (for example, square) planar shape, the light receiving area FXA may be sufficiently secured within the corresponding unit pixel UPX. Accordingly, the sensing capability (or sensing accuracy and recognition rate) of the photo-sensing pixel PSR may be increased by increasing an amount of light introduced (or incident) to the photo-sensing pixel PSR.

In addition, in the above-described embodiment, each of the sub-pixels SPX1, SPX2, and SPX3 disposed within each unit pixel UPX may include the light emitting area EMA having the polygonal (for example, hexagonal) planar shape extending primarily in one direction. Accordingly, as the distances (for example, the first and third distances d1 and d3) between the sub-pixels SPX1, SPX2, and SPX3 required according to the resolution of the display device DD and/or the distances (for example, the second and fourth distances d2 and d4) between the sub-pixels SPX1, SPX2, and SPX3 and the photo-sensing pixel PSR are secured and the light emitting area EMA of the sub-pixels SPX1, SPX2, and SPX3 is maximally secured, the luminous efficiency of each of the sub-pixels SPX1, SPX2, and SPX3 may be increased.

Hereinafter, a stacked structure of each of the sub-pixels SPX1, SPX2, and SPX3 including the light emitting element LD and each of the photo-sensing pixels PSR including the light receiving element OPD will be mainly described with reference to FIG. 7 and FIG. 8.

Figure 7:
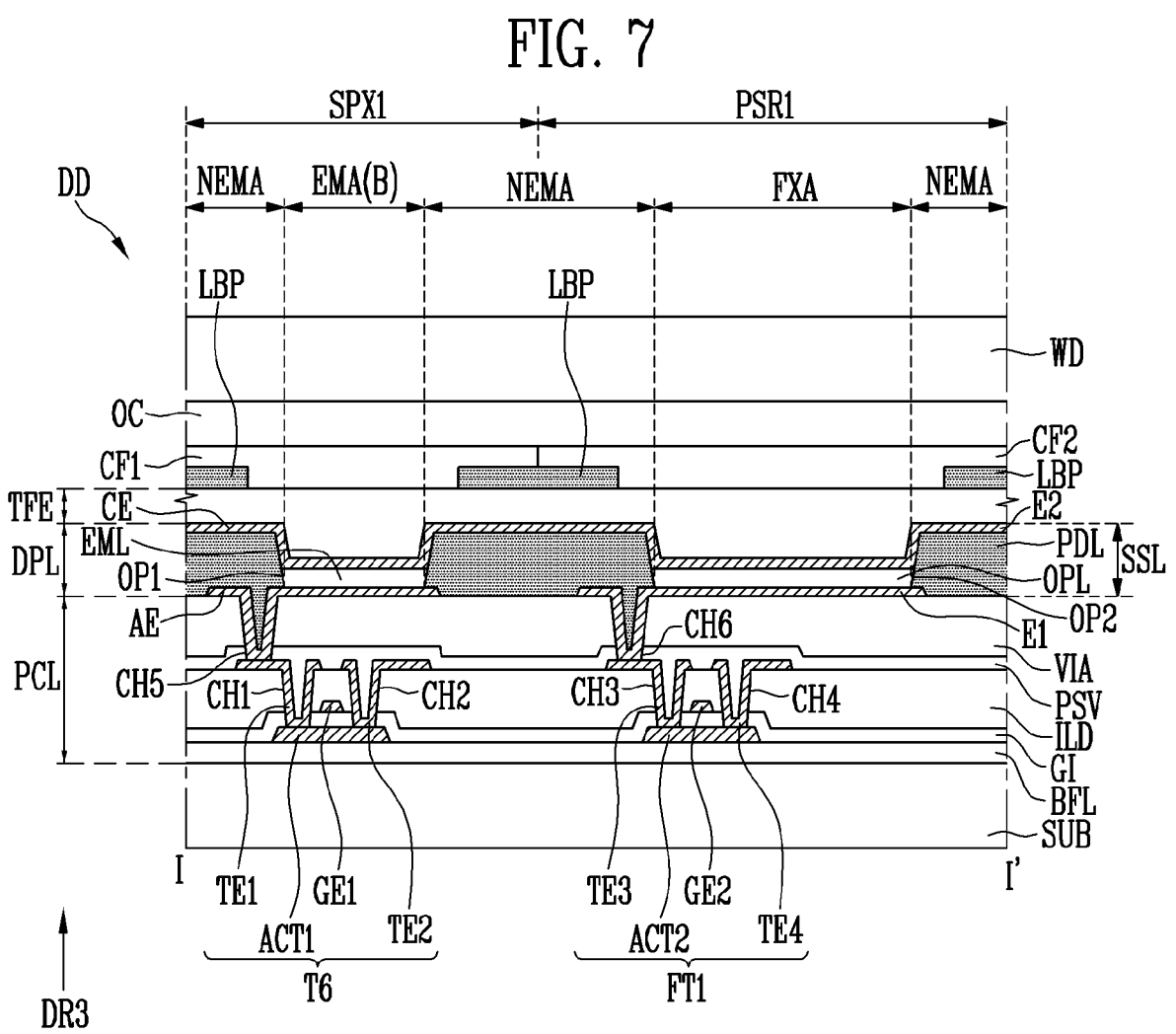
FIG. 7 illustrates a cross-sectional view taken along line I-I' of the portion 'EA' of FIG. 6.

FIG. 7 illustrates a cross-sectional view taken along line I-I' of the portion 'EA' of FIG. 6. FIG. 8 illustrates a cross-sectional view of a reflective path of light in the display device of FIG. 7. In FIG. 7 and FIG. 8, "formed and/or provided on the same layer" means formed in the same process, and "formed and/or provided on another layer" means formed in a different process.

Figure 8:
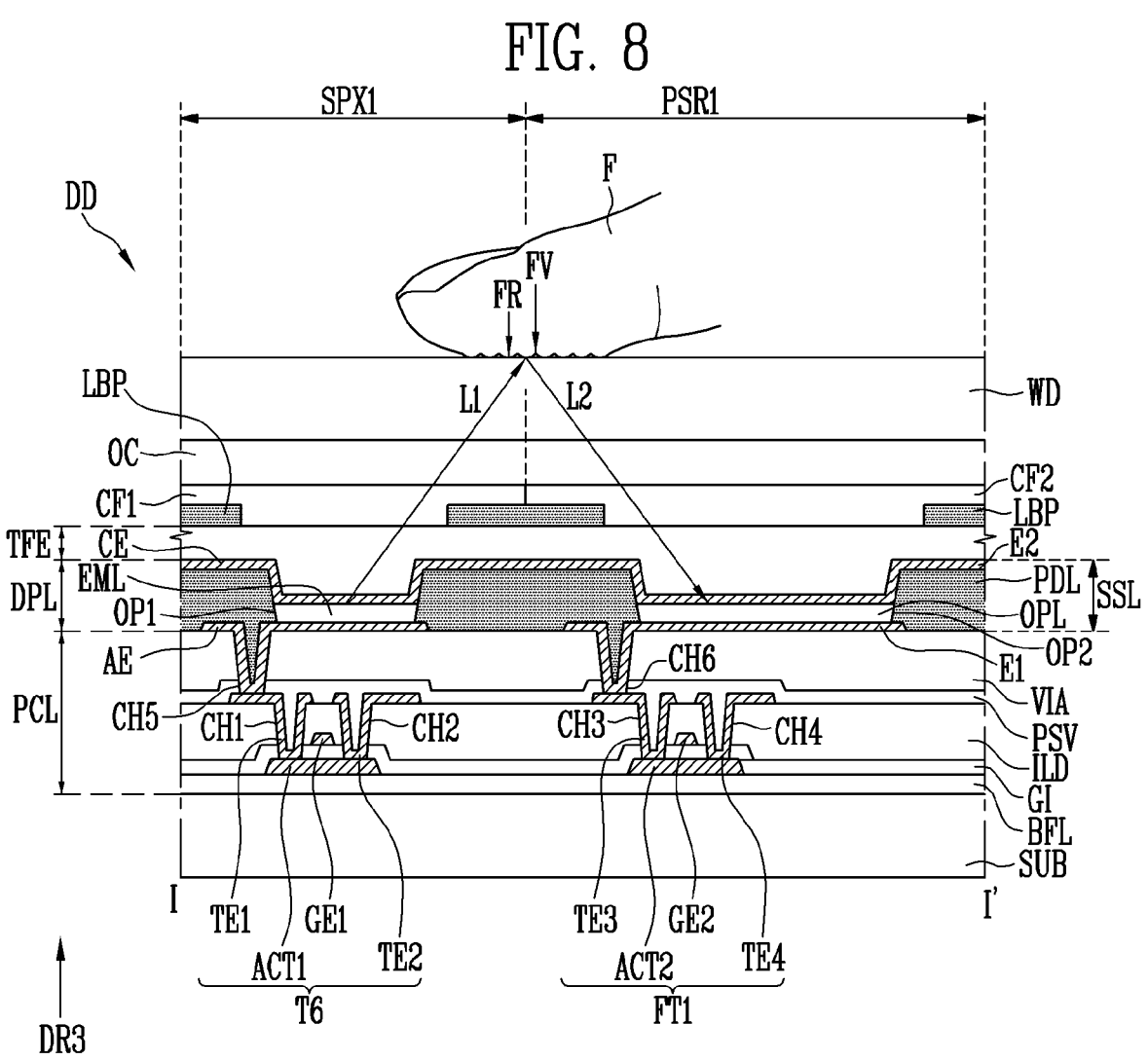
FIG. 8 illustrates a cross-sectional view of a reflective path of light in the display device of FIG. 7.

In FIG. 7 and FIG. 8, for better comprehension and ease of description, a cross-sectional structure of each sub-pixel will be described by using the first sub-pixel SPX1 among the sub-pixels SPX1, SPX2, and SPX3 as an example.

In addition, in FIG. 7 and FIG. 8, for better comprehension and ease of description, a cross-sectional structure of each photo-sensing pixel PSR will be described by using the first photo-sensing pixel PSR1 among the photo-sensing pixels PSR as an example.

In addition, in FIG. 7 and FIG. 8, only a cross-sectional structure of a portion corresponding to the sixth transistor T6 among the first to seventh transistors T1 to T7 shown in FIG. 4 and only a cross-sectional structure of a portion corresponding to the first sensor transistor FT1 among the first to third sensor transistors FT1 to FT3 are shown.

In addition, in FIG. 7 and FIG. 8, a longitudinal direction (or a vertical direction) in a cross-sectional view is illustrated as the third direction DR3.

In FIG. 7 and FIG. 8, differences from the above-described embodiments will be mainly described in order to avoid duplicate descriptions and so to the extent that an element is not described in detail, it may be understood that the element is at least similar to a corresponding element that has been described elsewhere within the present disclosure.

Referring to FIG. 1 to FIG. 8, the display device DD may include the first sub-pixel SPX1 and the first photo-sensing pixel PSR1 disposed on the substrate SUB.

The substrate SUB may include a transparent insulation material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which include a polymer organic material. For example, the flexible substrate may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate.

A pixel circuit layer PCL of the first sub-pixel SPX1 and a pixel circuit layer PCL of the first photo-sensing pixel PSR1 may be provided on the substrate SUB. The pixel circuit layer PCL may include a buffer layer BFL, a gate insulation layer GI, an interlayer insulation layer ILD, a passivation layer PSV, and a via layer VIA that are sequentially stacked on the substrate SUB along the third direction DR3.

The buffer layer BFL may prevent impurities from being diffused into the sixth transistor T6 included in the pixel circuit PXC and the first sensor transistor FT1 included in the sensor circuit SSC. The buffer layer BFL may be an inorganic insulation film including an inorganic material. The buffer layer BFL may include metal oxides such as a silicon nitride (SiNx), a silicon oxide (SiOx), a silicon oxynitride (SiOxNy), and/or an aluminum oxide (AlOx). The buffer layer BFL may be provide as a single layer, but may also be provide as a multilayer of at least double layers or more. When the buffer layer BFL is provided as multiple layers, respective layers thereof may be made of the same material or different materials. The buffer layer BFL may be omitted depending on the material, a process condition, and the like of the substrate SUB.

A semiconductor layer (or a semiconductor pattern) including a first active pattern ACT1 and a second active pattern ACT2 may be disposed on the buffer layer BFL. The semiconductor layer may include a poly-silicon semiconductor. For example, the semiconductor layer may be formed through a low temperature poly-silicon process (for example, a low temperature poly-silicon (LTPS) process). However, the present invention is not necessarily limited thereto, and at least a portion of the semiconductor layer may be formed of an oxide semiconductor, a metal oxide semiconductor, or the like.

Each of the first and second active patterns ACT1 and ACT2 may include a channel area, a first contact area connected to one end of the channel area, and a second contact area connected to the other end of the channel area. The channel area, the first contact area, and the second contact area may be formed of a semiconductor layer in which an impurity is not doped or an impurity is doped. For example, the first contact area and the second contact area may be formed of a semiconductor layer doped with an impurity, and the channel area may be formed of a semiconductor layer that is not doped with an impurity. As the impurity, for example, a p-type impurity may be used, but the present invention is not necessarily limited thereto. One of the first and second contact areas may be a source area, and the other thereof may be a drain area.

The gate insulation layer GI may be entirely provided and/or formed on the first and second active patterns ACT1, and ACT2 and the buffer layer BFL.

The gate insulation layer GI may be an inorganic film (or an inorganic insulation film) including an inorganic material. For example, the gate insulation layer GI may include metal oxides such as a silicon nitride (SiNx), a silicon oxide (SiOx), a silicon oxynitride (SiOxNy), and/or an aluminum oxide (AlOx). However, the material of the gate insulation layer GI is not necessarily limited to the above-described embodiments. In some embodiments, the gate insulation layer GI may be formed as an organic film (or organic insulation film) including an organic material. The gate insulation layer GI may be provided as a single layer, and may be provided as a multilayer of at least double layers or more.

A first gate electrode GE1 and a second gate electrode GE2 may be provided and/or formed on the gate insulation layer GI. The first gate electrode GE1 may be provided and/or formed on the gate insulation layer GI to correspond to the channel area of the first active pattern ACT1, and the second gate electrode GE2 may be provided and/or formed on the gate insulation layer GI to correspond to the channel area of the second active pattern ACT2. The first and second gate electrodes GE1 and GE2 may be formed to have a single layer structure of a single or a mixture thereof including copper (Cu), molybdenum (Mo), tungsten (W), aluminum neodymium (AlNd), titanium (Ti), aluminum (Al), silver (Ag), and/or an alloy thereof, or in order to reduce wire resistance, it may be formed to have a double layer or multilayer structure of molybdenum (Mo), titanium (Ti), copper (Cu), aluminum (Al) and/or silver (Ag), which are a low-resistance material.

The interlayer insulation layer ILD may be entirely provided and/or formed on the first and second gate electrodes GE1 and GE2 and the gate insulation layer GI.

The interlayer insulation layer ILD may include the same material as that of the gate insulation layer GI, or may include one or more materials selected from the materials illustrated as constituent materials of the gate insulation layer GI.

First, second, third, and fourth connection members TE1, TE2, TE3, and TE4 may be provided and/or formed on the interlayer insulation layer ILD.

The first, second, third, and fourth connection members TE1, TE2, TE3, and TE4 may be spaced apart from each other on the interlayer insulation layer ILD.

The first connection member TE1 may contact the first contact area of one end of the first active pattern ACT1 through a first contact hole CH1 formed in the interlayer insulation layer ILD and the gate insulation layer GI. When the first contact area is a source area, the first connection member TE1 may be a first source electrode.

The second connection member TE2 may contact the second contact area of the other end of the first active pattern ACT1 through a second contact hole CH2 formed in the interlayer insulation layer ILD and the gate insulation layer GI. When the second contact area is a drain area, the second connection member TE2 may be a second drain electrode.

The third connection member TE1 may contact the first contact area of one end of the first active pattern ACT2 through a third contact hole CH3 formed in the interlayer insulation layer ILD and the gate insulation layer GI. When the first contact area is a source area, the third connection member TE3 may be a second source electrode.

The fourth connection member TE4 may contact the second contact area of the other end of the first active pattern ACT2 through a fourth contact hole CH4 formed in the interlayer insulation layer ILD and the gate insulation layer GI. When the second contact area is a drain area, the fourth connection member TE4 may be a second drain electrode.

The first to fourth connection members TE1 to TE4 may include the same material as the first and second gate electrodes GE1 and GE2, or may include materials exemplified as constituent materials of the first and second gate electrodes GE1 and GE2.

The passivation layer PSV may be entirely provided and/or formed on the first to fourth connection members TE1 to TE4 and the interlayer insulation layer ILD.

The passivation layer PSV (or protective layer) may be an inorganic film (or an inorganic insulation film) including an inorganic material or an organic film (or an organic insulation film) including an organic material. The inorganic film may include, for example, metal oxides such as a silicon nitride (SiNx), a silicon oxide (SiOx), a silicon oxynitride (SiOxNy), and/or an aluminum oxide (AlOx). The organic film may be, for example, a polyacrylates resin, an epoxy resin, a phenolic resin, a polyamides resin, a polyimides rein, an unsaturated polyesters resin, a poly-phenylen ethers resin, a poly-phenylene sulfides resin, and/or a benzocyclobutene resin.

In some embodiments, the passivation layer PSV may include the same material as the interlayer insulation layer ILD, but is not necessarily limited thereto. The passivation layer PSV may be provided as a single layer, but may alternatively be provide as a multilayer of at least double layers or more.

The passivation layer PSV may be partially opened to include a fifth contact hole CH5 exposing one area of the first connection member TE1 and a sixth contact hole CH6 exposing one area of the third connection member TE3.

The via layer VIA may be entirely provided and/or formed on the passivation layer PSV.

The via layer VIA may be partially opened to include fifth and sixth contact holes CH5 and CH6 respectively corresponding to the fifth and sixth contact holes CH5 and CH6 of the passivation layer PSV. The via layer VIA may include the same material as the passivation layer PSV, or may include materials exemplified as constituent materials of the passivation layer PSV. In the embodiment, the via layer VIA may be an organic film made of an organic material.

FIG. 7 illustrates that the via layer VIA is provided on the passivation layer PSV, but is not necessarily limited thereto. In some embodiments, one of the passivation layer PSV and the via layer VIA may be omitted.

The display element layer DPL may be provided and/or formed on the pixel circuit layer PCL of the first sub-pixel SPX1, and the sensor layer SSL may be provided and/or formed on the pixel circuit layer PCL of the first photosensing pixel PSR.

The display element layer DPL may include the light emitting element LD and the pixel defining film PDL. The light emitting element LD may include the anode electrode AE (or first pixel electrode), the light emitting layer EML, and the cathode electrode CE (or second pixel electrode). The light emitting element LD may be electrically connected to the sixth transistor T6 of the pixel circuit PXC.

The sensor layer SSL may include the light receiving element OPD and the pixel defining film PDL. The light receiving element OPD may be an optical fingerprint sensor. For example, the light receiving element OPD may be formed of a photo diode, a CMOS image sensor, a CCD camera, a photo transistor, or the like, but is not necessarily limited thereto. The light receiving element OPD may recognize a fingerprint by sensing light reflected by a valley FV between a ridge FR and a ridge FR of a finger F. For example, when the user's finger F is in contact with the window WD, first light L1 outputted from the light emitting element LD (or the light emitting layer EML) is reflected by the ridge FR or the valley FV of the finger F, and reflected second light L2 may reach the light receiving element OPD (or the light receiving layer OPL) of the sensor layer SSL. The light receiving element OPD distinguishes the second light L2 reflected from the ridge FR of the finger F and the second light L2 reflected from the valley FV of the finger F, thereby recognizing a pattern of the user's fingerprint.

The light receiving element OPD may be electrically connected to the first sensor transistor FT1 of the sensor circuit SSC. The light receiving element OPD may include the first electrode E1 (or first sensor electrode), the light receiving layer OPL (or photoelectric conversion layer), and the second electrode E2 (or second sensor electrode).

The anode electrode AE and the first electrode E1 may be made of a metal layer such as Ag, Mg, Al, Pt, Pd, Au, Ni, Nd, Ir, Cr, and an alloy thereof and/or an indium tin oxide (ITO), an indium zinc oxide (IZO), a zinc oxide (ZnOx), and indium tin zinc oxide (ITZO). The anode electrode AE may be electrically connected to the sixth transistor T6 through the fifth contact hole CH5 formed in the via layer VIA and the passivation layer PSV. The first electrode E1 may be electrically connected to the first sensor transistor FT1 through the sixth contact hole CH6 formed in the via layer VIA and the passivation layer PSV.

The anode electrode AE and the first electrode E1 may be simultaneously formed by the same process using a mask, but are not necessarily limited thereto.

The pixel defining film PDL (or the bank) may be entirely provided and/or formed on the anode electrode AE, the first electrode E1, and the via layer VIA.

The pixel defining film PDL may define (or partition) the light emitting area EMA of the first sub-pixel SPX1 and the light receiving area FXA of the first photo-sensing pixel PSR1. The pixel defining film PDL may be an organic insulation layer made of an organic material. The organic material may include an acryl resin, an epoxy resin, a phenolic resin, a polyamide resin, a polyimide resin, or the like.

In some embodiments, the pixel defining film PDL may include a light absorbing material, or may serve to absorb light introduced from the outside by a light absorbing agent being applied thereon. For example, the pixel defining film PDL may include a carbon-based black pigment. However, it is not necessarily limited thereto, and the pixel defining film PDL may include an opaque metallic material such as chromium (Cr), molybdenum (Mo), an alloy (MoTi) of molybdenum (Mo) and titanium (Ti), tungsten (W), vanadium (V), niobium (Nb), tantalum (Ta), manganese (Mn), cobalt (Co), and/or nickel (Ni), which has a high light absorption rate.

The pixel defining film PDL includes a first opening OP1 exposing one area (for example, a portion of an upper surface) of the anode electrode AE and a second opening OP2 exposing one area (for example, a portion of an upper surface) of the first electrode E1, and may protrude from the via layer VIA to the third direction DR3 along a circumference of the light emitting area EMA and a circumference of the light receiving area FXA.

The first opening OP1 of the pixel defining film PDL may correspond to the light emitting area EMA, and the second opening OP2 of the pixel defining film PDL may correspond to the light receiving area FXA. The pixel defining film PDL may be patterned to include a polygonal (for example, hexagonal) first opening OP1 so that, in a process using a mask, the light emitting area EMA of the first sub-pixel SPX1 may have a polygonal (for example, hexagonal) planar shape. In addition, the pixel defining film PDL may be patterned to include a quadrilateral (for example, square) second opening OP2 so that, in the above-described process, the light receiving area FXA of the first photo-sensing pixel PSR1 may have a quadrilateral (for example, square) planar shape.

The light emitting layer EML may be provided and/or formed on the anode electrode AE exposed by the first opening OP1 of the pixel defining film PDL. The light emitting layer EML may include an organic material to emit light of a predetermined color (for example, blue light (B)). For example, the light emitting layer EML may include a hole transporting layer, an organic material layer, and an electron transporting layer.

The light receiving layer OPL may be provided and/or formed on the first electrode E1 exposed by the second opening OP2 of the pixel defining film PDL. The light receiving layer OPL may serve to absorb and detect the second light L2 reflected or scattered from the fingerprint of the user's finger F. In this case, the light receiving layer OPL may recognize the fingerprint by sensing a difference in an amount of light reflected or scattered from the ridge FR or valley FV of the fingerprint of the user's finger F. Holes and electrons freed when the light receiving layer OPL absorbs light may be transmitted to the cathode electrode CE and the second electrode E2, respectively.

The light receiving layer OPL may be made of an organic photosensitive material. For example, the organic photosensitive material may include a dithiolene-based material (BDN) (bis(4-dimethylaminodithiobenzyl)nickel(II)), a benzotriazole-based polymer compound (PTZBTTT-BDT), or a porphyrin-based small molecule material (DHTBTEZP), but is not necessarily limited thereto.

An electron transporting layer may be provided on the light emitting layer EML and the light receiving layer OPL.

The cathode electrode CE may be provided and/or formed on the light emitting layer EML of the first sub-pixel SPX1, and the second electrode E2 may be provided and/or formed on the light receiving layer OPL of the first photo-sensing pixel PSR1. In the embodiment, the cathode electrode CE and the second electrode E2 may be a common electrode integrally formed in the display area DA. A voltage of the second driving power source VSS may be supplied to the cathode electrode CE and the second electrode E2.

The cathode electrode CE and the second electrode E2 may be made of a metal layer such as Ag, Mg, Al, Pt, Pd, Au, Ni, Nd, Ir, or Cr, and/or a transparent conductive layer such as ITO, IZO, ZnO, or ITZO. In the embodiment, the cathode electrode CE and the second electrode E2 may be formed of a multilayer of a double layer or more including a thin metal layer, for example, a triple layer of ITO/Ag/ITO.

The thin film encapsulation layer TFE may be entirely provided and/or formed on the cathode electrode CE and the second electrode E2.

Since the thin film encapsulation layer TFE has the same configuration as the thin film encapsulation layer TFE described with reference to FIG. 5, a description thereof will be omitted and so to the extent that an element is not described in detail, it may be understood that the element is at least similar to a corresponding element that has been described elsewhere within the present disclosure.

A light blocking pattern LBP may be provided and/or formed on the thin film encapsulation layer TFE to correspond to the non-light emitting area NEMA of the first sub-pixel SPX1 and the non-light emitting area NEMA of the first photo-sensing pixel PSR1.

The light blocking pattern LBP may include a light blocking material preventing light leakage defects in which light leaks between the first sub-pixel SPX1 and a sub-pixel adjacent thereto. For example, the light blocking pattern LBP may include a black matrix, but is not necessarily limited thereto. In some embodiments, the light blocking pattern LBP may include carbon black (CB) and/or titanium black (TiBK). In addition, the light blocking pattern LBP may prevent color mixing of light emitted from the first sub-pixel SPX1 and each of the sub-pixels adjacent thereto.

In the first sub-pixel SPX1, the light blocking pattern LBP may be partially opened so as to not overlap the light emitting area EMA. An opening of the light blocking pattern LBP may provide an optical passage so that the first light L1 emitted from the light emitting element LD may travel to an upper portion of the display device DD. Thus, the opening of the light blocking pattern LBP may overlap the light emitting element LD (or the light emitting area EMA).

In the first photo-sensing pixel PSR1, the light blocking pattern LBP may be partially opened so as to not overlap the light receiving area FXA. The opening of the light blocking pattern LBP may provide an optical passage so that the second light L2 reflected from the fingerprint of the user's finger F may travel to the light receiving element OPD. Thus, the opening of the light blocking pattern LBP may overlap the light receiving element OPD (or the light receiving area FXA).

Color filters CF1 and CF2 may be disposed on the light blocking pattern LBP and the thin film encapsulation layer TFE.

The color filters CF1 and CF2 may include a first color filter CF1 disposed on at least one surface of the light blocking pattern LBP and the thin film encapsulation layer TFE of the first sub-pixel SPX1 and a second color filter CF2 disposed on at least one surface of the light blocking pattern LBP and the thin film encapsulation layer TFE of the first photo-sensing pixel PSR. Hereinafter, the light blocking pattern LBP of the first sub-pixel SPX1 is referred to as a first light blocking pattern, and the light blocking pattern LBP of the first photo-sensing pixel PSR is referred to as a second light blocking pattern.

The first color filter CF1 may be disposed within the opening of the first light blocking pattern LBP to be in direct contact with the thin film encapsulation layer TFE exposed by the opening of the first light blocking pattern LBP. The first color filter CF1 may overlap the light emitting element LD (or the light emitting area EMA). For better comprehension and ease of description, only the first sub-pixel SPX1 is shown in FIG. 7, and the first color filter CF1 may be a blue color filter. The first color filter CF1 may further include a green color filter overlapping the light emitting area EMA of the second sub-pixel SPX2 and a red color filter overlapping the light emitting area EMA of the third sub-pixel SPX3.

The second color filter CF2 may be disposed within the opening of the second light blocking pattern LBP to be in direct contact with the thin film encapsulation layer TFE exposed by the opening of the second light blocking pattern LBP. The second color filter CF2 may overlap the light receiving element OPD (or the light receiving area FXA). The second color filter CF2 may include one of a red color filter, a green color filter, and a blue color filter according to color light sensed by the light receiving layer OPL. For example, when the light receiving layer OPL absorbs light in a green wavelength band, the second color filter CF2 may be a green filter. For example, the second color filter CF2 may be set regardless of the light emitting colors of the sub-pixels SPX1, SPX2, and SPX3 adjacent thereto.

The light blocking pattern LBP and the color filters CF1 and CF2 described above may be utilized as an anti-reflection layer that blocks reflection of external light. Since the display device DD (or the display panel DP) includes the light blocking pattern LBP and the color filters CF1 and CF2 utilized as an anti-reflection layer, it might not be provided with a separate polarization layer. Accordingly, luminance deterioration may be prevented and a thickness of the display device DD may be minimized.

In addition, since the light receiving element OPD is formed on the same layer as the light emitting element LD, the thickness of the display device DD may be further reduced, and since the incident amount of external light to the light receiving element OPD is increased, the photo-sensing performance may be increased. In addition, since the sensor circuit SSC is simultaneously formed during the manufacturing process of the pixel circuit PXC and the light receiving element OPD is simultaneously formed during the manufacturing process of the light emitting element LD, the process time and manufacturing cost of the display device DD may be reduced.

A planarization layer OC may be further disposed between the first and second color filters CF1 and CF2 and the window WD. The planarization layer OC may serve to planarize steps caused by components disposed thereunder. The planarization layer OC may be an organic film. The organic film may include an acryl resin, an epoxy resin, a phenolic resin, a polyamide resin, or a polyimide resin, but is not necessarily limited thereto.

Figure 9:
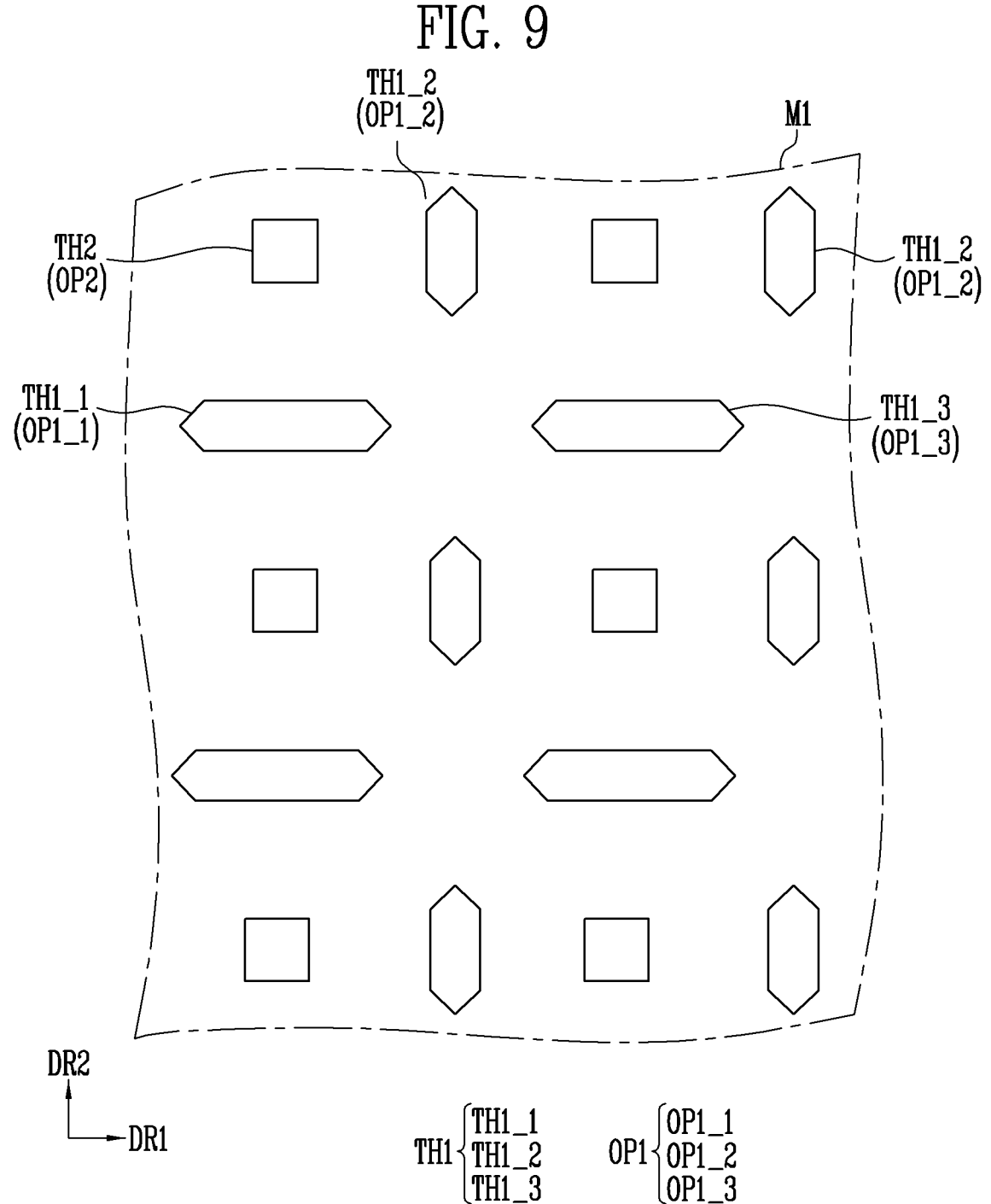
FIG. 9 illustrates a schematic top plan view of a first mask for forming a pixel defining film provided in sub-pixels and a photo-sensing pixel according to embodiments of the present invention.

FIG. 9 illustrates a schematic top plan view of a first mask for forming a pixel defining film provided in sub-pixels and a photo-sensing pixel according to embodiments of the present invention.

Referring to FIG. 6 and FIG. 9, a first mask M1, according to an embodiment, may include a first through hole TH1 and a second through hole TH2. The first mask M1 is a mask used when depositing a pixel defining film (for example, the pixel defining film PDL of FIG. 5), and may be a fine metal mask (FMM). The first mask M1 may be manufactured by forming a through hole in a metal plate and then stretching it.

The first and second through holes TH1 and TH2 may be spaced apart from each other. Each of the first and second through holes TH1 and TH2 may be provided in plural.

The first through hole TH1 may include a (1-1)-th through hole TH1_1, a (1-2)-th through hole TH1_2, and a (1-3)-th through hole TH1_3 that are spaced apart from each other.

The (1-1)-th through hole TH1_1 may have a polygonal shape. For example, the (1-1)-th through hole TH1_1 may have a hexagonal shape in which a width in the first direction DR1 and a width in the second direction DR2 are different. In the embodiment, the (1-1)-th through hole TH1_1 is for forming the first opening (for example, the first opening OP1 of FIG. 5) of the pixel defining film PDL defining the light emitting area EMA of the first sub-pixel SPX1, and a size thereof may be substantially the same as or similar to that of the first opening OP1 (hereinafter referred to as a (1-1)-th opening OP1_1). The (1-1)-th opening OP1_1 may have a shape corresponding to the (1-1)-th through hole TH1_1 of the first mask M1. For example, the (1-1)-th opening OP1_1 may have a polygonal (for example, hexagonal) shape. Accordingly, the light emitting area EMA of the first sub-pixel SPX1 may have a polygonal (for example, hexagonal) planar shape extending along one direction (for example, the first direction DR1).

The (1-2)-th through hole TH1_2 may have a polygonal shape. For example, the (1-2)-th through hole TH1_2 may have a hexagonal shape in which a width in the first direction DR1 and a width in the second direction DR2 are different. In the embodiment, the (1-2)-th through hole TH1_2 is for forming the first opening OP1 of the pixel defining film PDL defining the light emitting area EMA of the second sub-pixel SPX2, and a size thereof may be the same as or similar to that of the first opening OP1 (hereinafter referred to as a (1-2)-th opening OP1_2). The (1-2)-th opening OP1_2 may have a shape corresponding to the (1-2)-th through hole TH1_2 of the first mask M1. For example, the (1-2)-th opening OP1_2 may have a polygonal (for example, hexagonal) shape. Accordingly, the light emitting area EMA of the second sub-pixel SPX2 may have a polygonal (for example, hexagonal) planar shape extending along one direction (for example, the second direction DR2).

The (1-3)-th through hole TH1_3 may have a polygonal shape. For example, the (1-3)-th through hole TH1_3 may have a hexagonal shape in which a width in the first direction DR1 and a width in the second direction DR2 are different. In the embodiment, the (1-3)-th through hole TH1_3 is for forming the first opening (for example, the first opening OP1 of FIG. 5) of the pixel defining film PDL defining the light emitting area EMA of the third sub-pixel SPX3, and a size thereof may be substantially the same as or similar to that of the first opening OP1 (hereinafter referred to as a (1-3)-th opening OP13). The (1-3)-th opening OP1_3 may have a shape corresponding to the (1-3)-th through hole TH1_3 of the first mask M1. For example, the (1-3)-th opening OP1_3 may have a polygonal (for example, hexagonal) shape. Accordingly, the light emitting area EMA of the third sub-pixel SPX3 may have a polygonal (for example, hexagonal) planar shape extending along one direction (for example, the first direction DR1).

The second through hole TH2 may have a square shape in which a width in the first direction DR1 and a width in the second direction DR2 are substantially the same. In the embodiment, the second through hole TH2 is for forming the second opening OP2 of the pixel defining film PDL defining the light receiving area FXA of the photo-sensing pixel PSR, and a size thereof may correspond to the second opening OP2. The second opening OP2 may have a shape corresponding to the second through hole TH2 of the first mask M1. For example, the second opening OP2 may have a square shape. Accordingly, the light receiving area FXA of the photo-sensing pixel PSR may have a square planar shape.

Figure 10A:
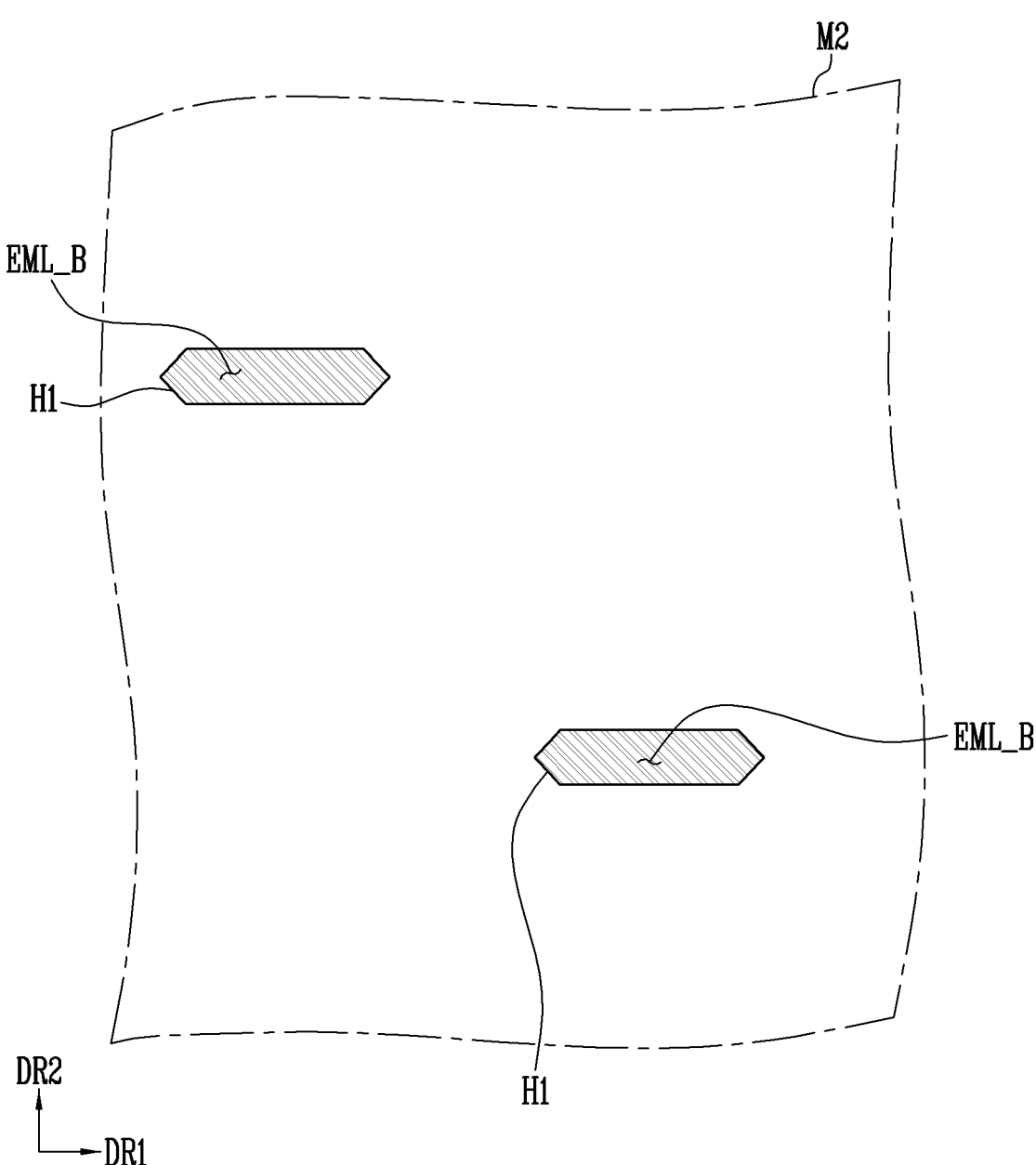
FIGS. 10A and 10B illustrate schematic top plan views of a second mask for forming a light emitting layer of a first sub-pixel among sub-pixels according to embodiments of the present invention.
Figure 10B:
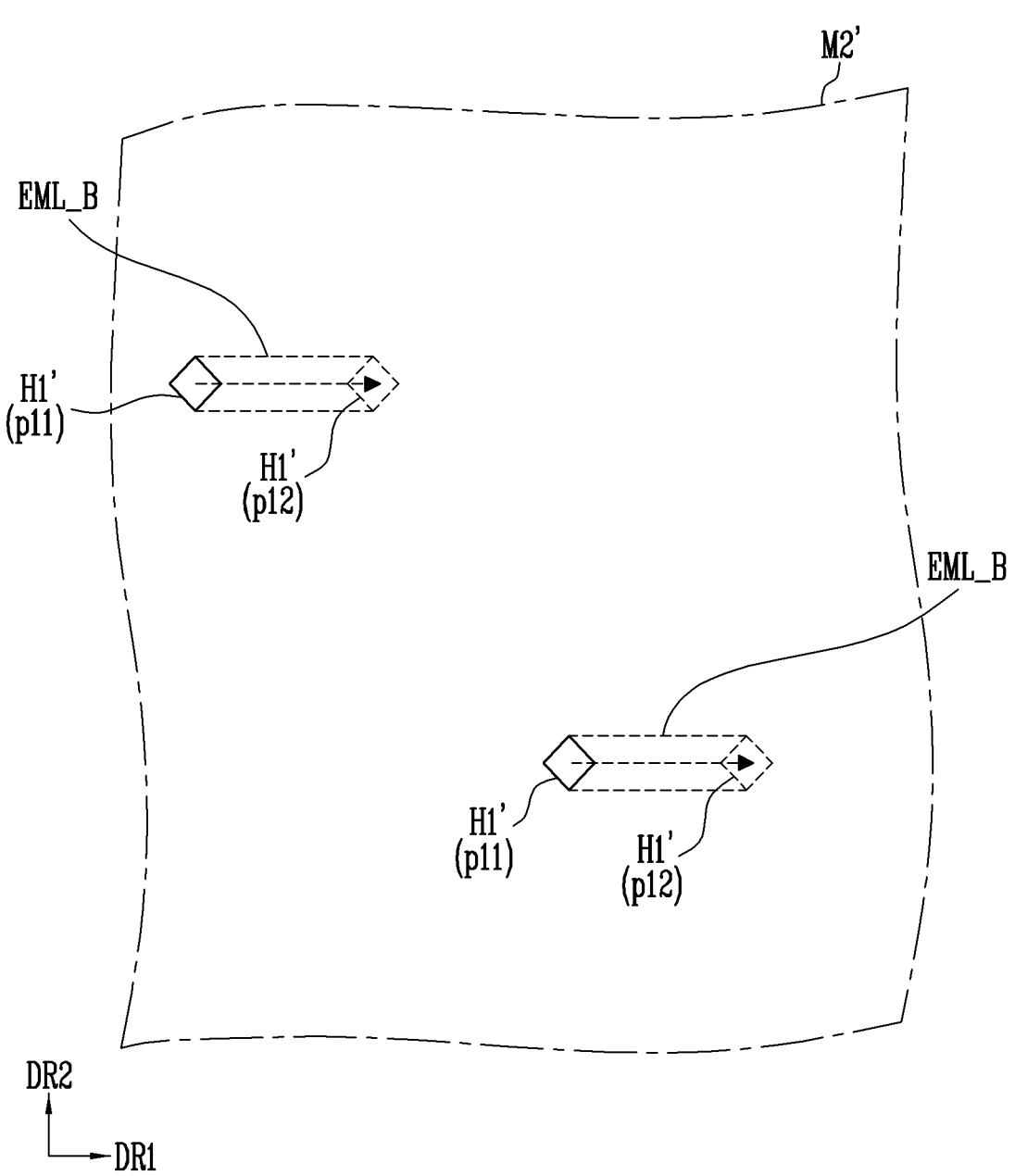

FIGS. 10A and 10B illustrate schematic top plan views of a second mask for forming a light emitting layer of a first sub-pixel among sub-pixels according to embodiments of the present invention.

Referring to FIG. 6, FIG. 9, and FIG. 10A, a second mask M2, according to an embodiment, may include a plurality of first holes H1. The second mask M2 is a mask used to form a light emitting layer EML_B on the anode electrode (for example, the anode electrode AE of FIG. 5) exposed by the (1-1)-th opening OP1_1 of the pixel defining film PDL, and may be a fine metal mask (FMM). The light emitting layer EML_B may be an organic light emitting layer of the first sub-pixel SPX1.

The first holes H1 may be spaced apart from each other.

Each of the first holes H1 may have a polygonal shape. For example, each of the first holes H1 may have a hexagonal shape in which a width in the first direction DR1 and a width in the second direction DR2 are different. In the embodiment, each of the first holes H1 is for forming the light emitting layer EML_B in the (1-1)-th opening OP1_1 of the pixel defining film PDL, and a size thereof may be substantially the same as or similar to that of the (1-1)-th opening OP1_1.

A material (or an organic material) that has passed through each of the first holes H1 of the second mask M2 is applied within the (1-1)-th opening OP1_1 of the pixel defining film PDL, thereby forming the light emitting layer EML_B of the first sub-pixel SPX1. The light emitting layer EML_B may have a planar shape corresponding to each of the first holes H1 and the (1-1)-th opening OP1_1. The light emitting layer EML_B of the first sub-pixel SPX1 has a polygonal (hexagonal) planar shape extending along the first direction DR1, so that an area (or a size) of the light emitting area EMA of the first sub-pixel SPX1 defined by the light emitting layer EML_B may be determined.

However, the embodiment of the present invention is not necessarily limited thereto. For example, referring further to FIG. 10B, each of first holes H1' may have a rhombus (or square) shape. In the embodiment, in order to form the light emitting layer EML_B within the (1-1)-th opening OP1_1 of the pixel defining film PDL, each of the first holes H1', by moving a second mask M2' along the first direction DR1, may be moved from a (1-1)-th position p11 to a (1-2)-th position p12. As each of the first holes H1' is moved from the (1-1)-th position p11 to the (1-2)-th position p12, the light emitting layer EML_B may be formed in the (1-1)-th opening OP1_1 of the pixel defining film PDL.

Figure 11A:
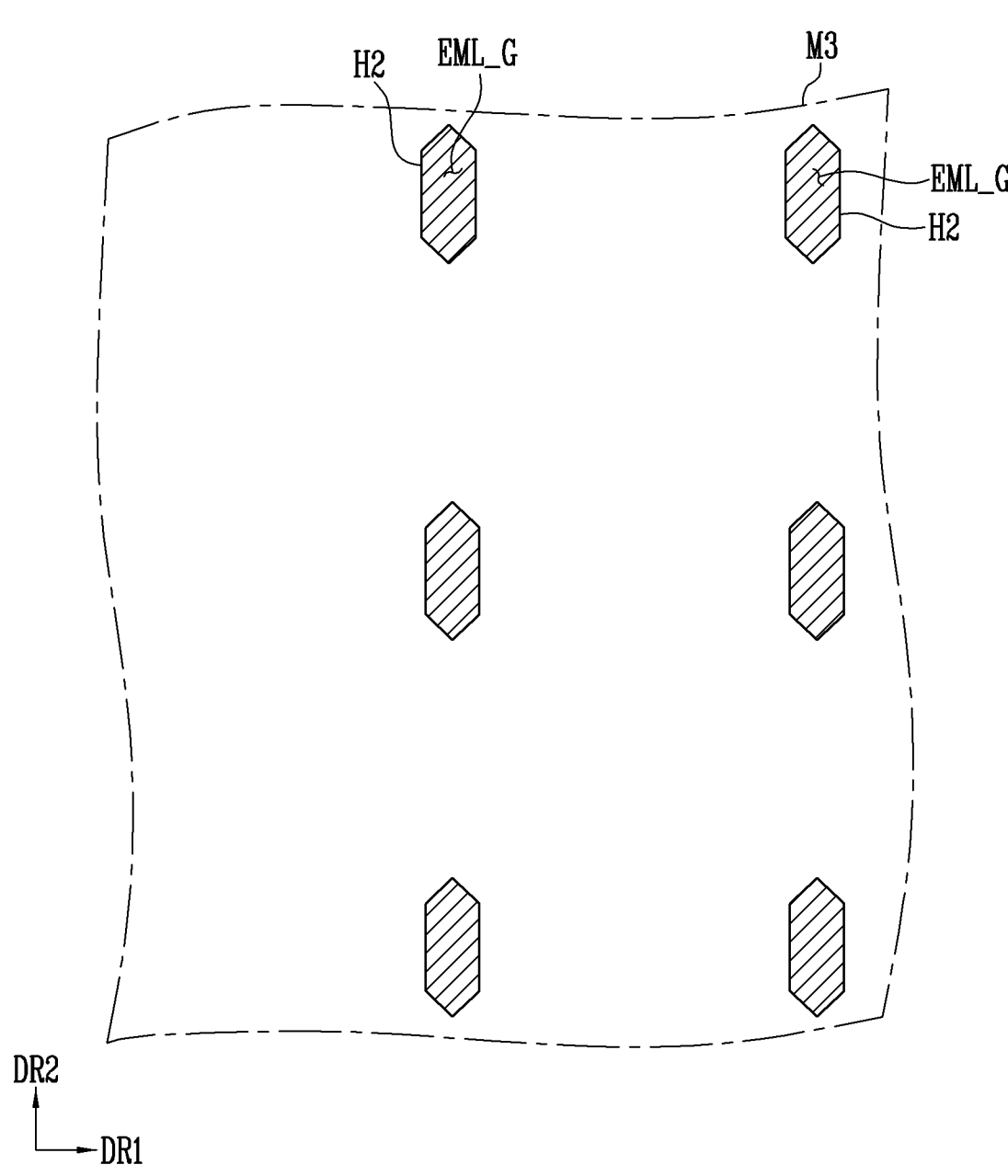
FIGS. 11A and 11B illustrate schematic top plan views of a third mask for forming a light emitting layer of a second sub-pixel among sub-pixels according to embodiments of the present invention.
Figure 11B:
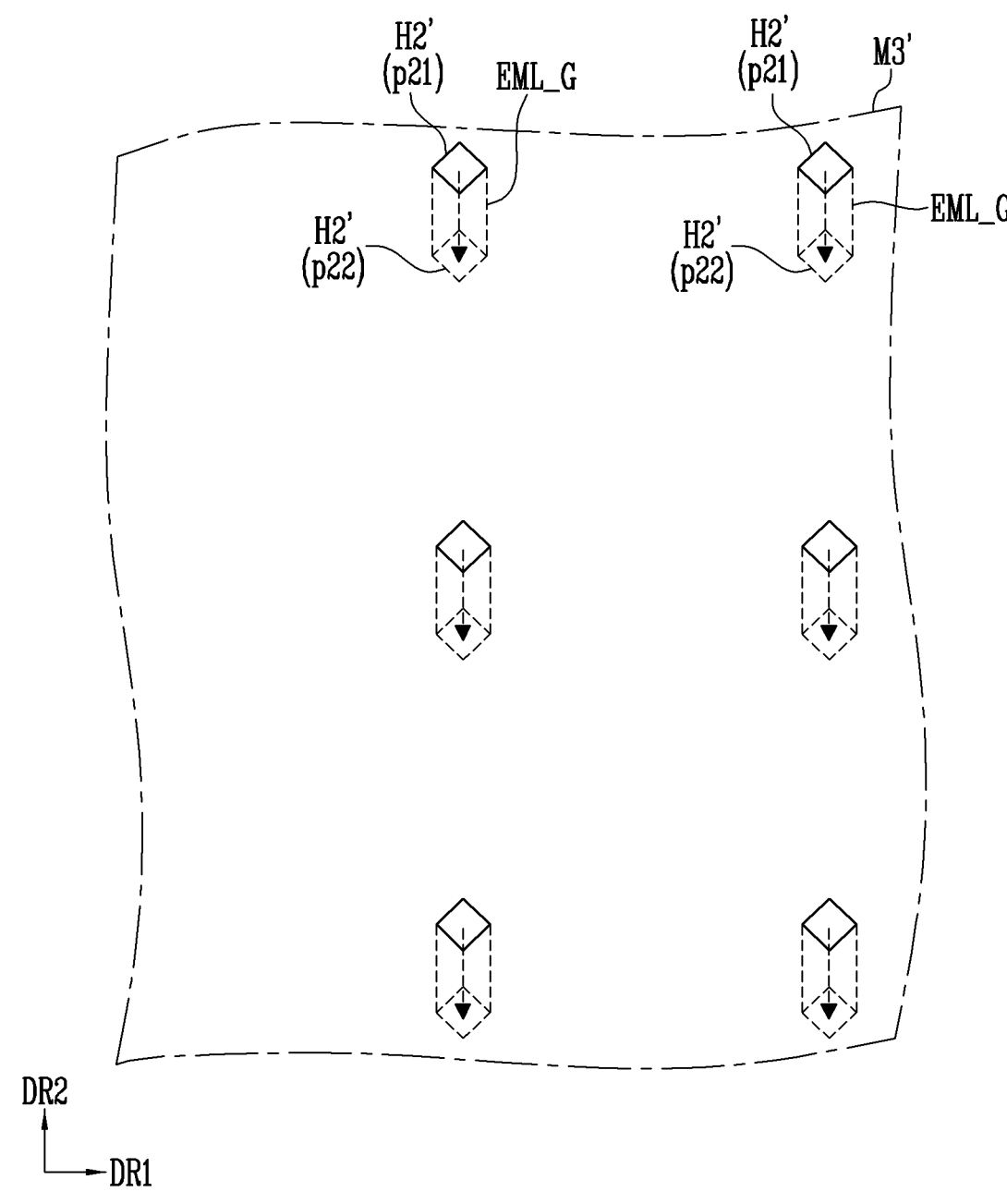

FIGS. 11A and 11B illustrate schematic top plan views of a third mask for forming a light emitting layer of a second sub-pixel among sub-pixels according to embodiments of the present invention.

Referring to FIG. 6, FIG. 9, FIG. 10A, and FIG. 11A, a third mask M3, according to an embodiment, may include a plurality of second holes H2. The third mask M3 is a mask used to form a light emitting layer EML_G on the anode electrode (for example, the anode electrode AE of FIG. 5) exposed by the (1-2)-th opening OP12 of the pixel defining film PDL, and may be a fine metal mask (FMM). The light emitting layer EML_G may be an organic light emitting layer of the second sub-pixel SPX2.

The second holes H2 may be spaced apart from each other. In the embodiment, the second holes H2 may be designed to have different sizes from the first holes H1 of the second mask M2.

Each of the second holes H2 may have a polygonal shape. For example, each of the second holes H2 may have a hexagonal shape in which a width in the first direction DR1 and a width in the second direction DR2 are different. In the embodiment, each of the second holes H2 is for forming the light emitting layer EML_G in the (1-2)-th opening OP1_2 of the pixel defining film PDL, and a size thereof may be substantially the same as or similar to that of the (1-2)-th opening OP1_2.

A material (or an organic material) that has passed through each of the second holes H2 of the third mask M3 is applied within the (1-2)-th opening OP1_2 of the pixel defining film PDL, thereby configuring the light emitting layer EML_G of the second sub-pixel SPX2. The light emitting layer EML_G may have a planar shape corresponding to each of the second holes H2 and the (1-2)-th opening OP1_2. The light emitting layer EML_G of the second sub-pixel SPX2 has a polygonal (hexagonal) planar shape extending along the second direction DR2, so that an area (or a size) of the light emitting area EMA of the second sub-pixel SPX2 defined by the light emitting layer EML_G may be determined.

However, the embodiment of the present invention is not necessarily limited thereto. For example, referring to FIG. 11B, each of second holes H2' may have a rhombus (or square) shape. In the embodiment, in order to form the light emitting layer EML_G within the (1-2)-th opening OP1_2 of the pixel defining film PDL, each of the second holes H2', by moving a third mask M3' along the second direction DR2 (or a direction opposite to the second direction DR2), may be moved from a (2-1)-th position p21 to a (2-2)-th position p22. As each of the second holes H2' is moved from the (2-1)-th position p21 to the (2-2)-th position p22, the light emitting layer EML_G may be formed in the (1-2)-th opening OP1_2 of the pixel defining film PDL.

Figure 12A:
FIGS. 12A and 12B illustrate schematic top plan views of a fourth mask for forming a light emitting layer of a third sub-pixel among sub-pixels according to embodiments of the present invention.
Figure 12B:
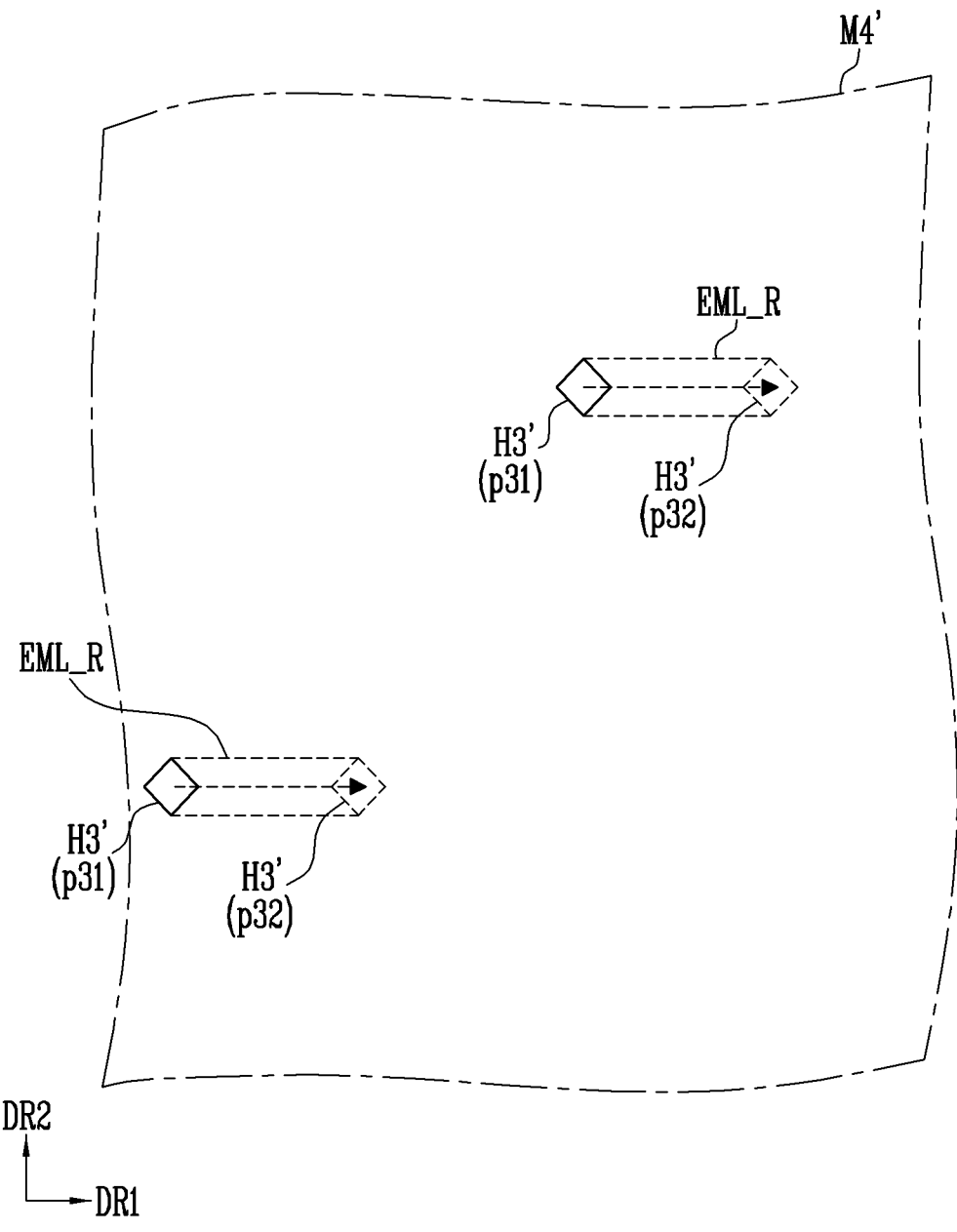

FIGS. 12A and 12B illustrate schematic top plan views of a fourth mask for forming a light emitting layer of a third sub-pixel among sub-pixels according to embodiments of the present invention.

Referring to FIG. 6, FIG. 9, FIG. 10A, FIG. 11A, and FIG. 12A, a fourth mask M4 may include a plurality of third holes H3. The fourth mask M4 is a mask used to form a light emitting layer EML_R on the anode electrode (for example, the anode electrode AE of FIG. 5) exposed by the (1-3)-th opening OP1_3 of the pixel defining film PDL, and may be a fine metal mask (FMM). The light emitting layer EML_R may be an organic light emitting layer of the third sub-pixel SPX3.

The third holes H2 may be spaced apart from each other. In the embodiment, the third holes H3 may be designed to have different sizes from the first holes H1 of the second mask M2 and the second holes H2 of the third mask M3, but are not necessarily limited thereto.

Each of the third holes H3 may have a polygonal shape. For example, each of the third holes H3 may have a hexagonal shape in which a width in the first direction DR1 and a width in the second direction DR2 are different. In the embodiment, each of the third holes H3 is for forming the light emitting layer EML_R in the (1-3)-th opening OP1_3 of the pixel defining film PDL, and a size thereof may be substantially the same as or similar to that of the (1-3)-th opening OP1_3.

A material (or an organic material) that has passed through each of the third holes H3 of the fourth mask M4 is applied within the (1-3)-th opening OP1_3 of the pixel defining film PDL, thereby forming the light emitting layer EML_R of the third sub-pixel SPX3. The light emitting layer EML_R may have a planar shape corresponding to each of the third holes H3 and the (1-3)-th opening OP1_3. The light emitting layer EML_R of the third sub-pixel SPX3 has a polygonal (hexagonal) planar shape extending along the first direction DR1, so that an area (or a size) of the light emitting area EMA of the third sub-pixel SPX3 defined by the light emitting layer EML_R may be determined.

However, the embodiment of the present invention is not necessarily limited thereto. For example, referring further to FIG. 12B, each of third holes H3' may have a rhombus (or square) shape. In the embodiment, in order to form the light emitting layer EML_R within the (1-3)-th opening OP1_3 of the pixel defining film PDL, each of the third holes H3', by moving a second mask M4' along the first direction DR1, may be moved from a (3-1)-th position p31 to a (3-2)-th position p32. As each of the third holes H3' is moved from the (3-1)-th position p31 to the (3-2)-th position p32, the light emitting layer EML_R may be formed in the (1-3)-th opening OP1_3 of the pixel defining film PDL.

Figure 13:
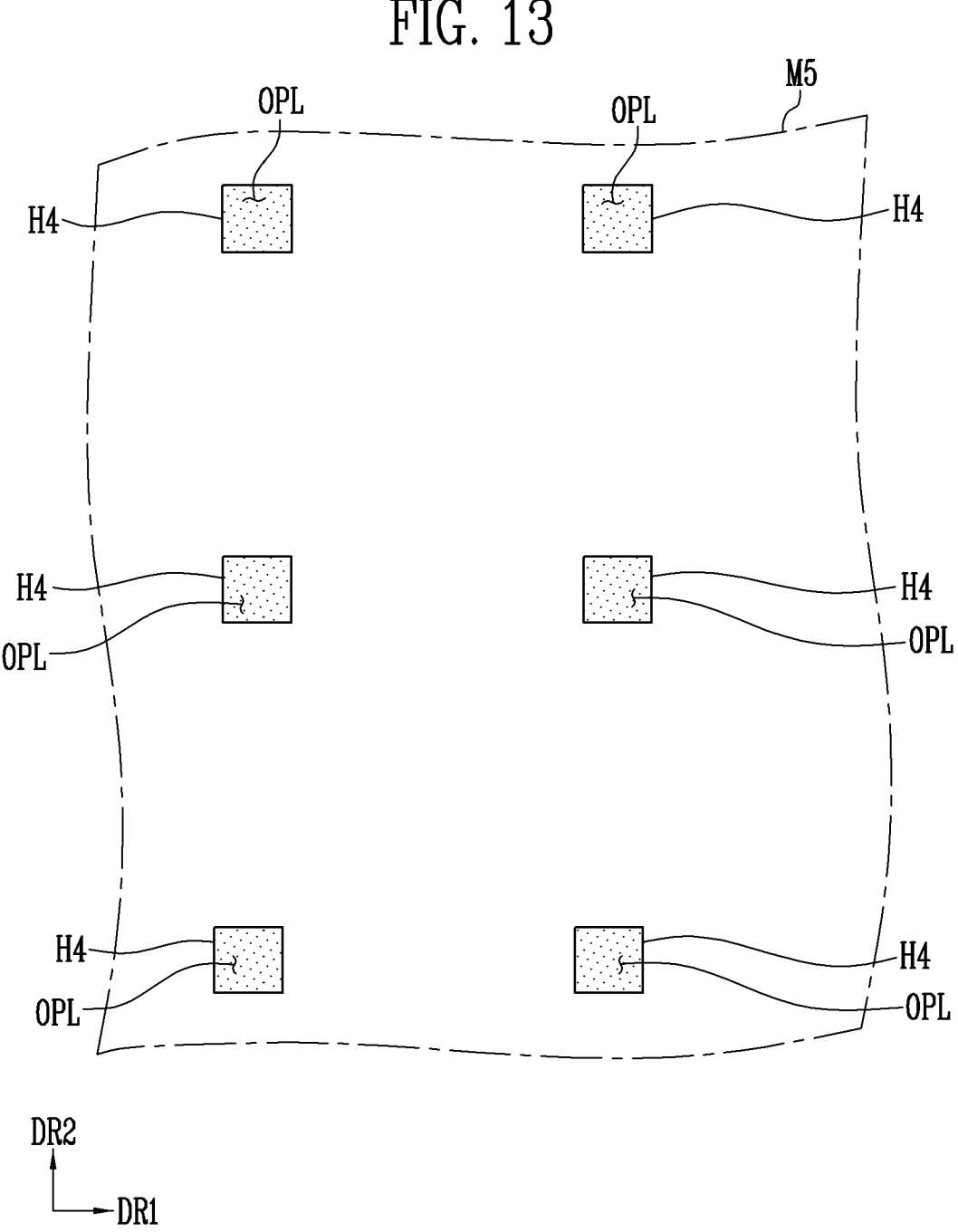
FIG. 13 illustrates a schematic top plan view of a fifth mask for forming a light receiving layer of a photo-sensing pixel according to embodiments of the present invention.

FIG. 13 illustrates a schematic top plan view of a fifth mask for forming a light receiving layer of a photo-sensing pixel according to embodiments of the present invention.

Referring to FIG. 6, FIG. 9, FIG. 10A, FIG. 11A, FIG. 12A, and FIG. 13, a fifth mask M5 may include a plurality of fourth holes H4. The fifth mask M5 is a mask used to form the light receiving layer OPL on the first electrode (for example, the first electrode E1 of FIG. 5) exposed by the second opening OP2 of the pixel defining film PDL, and may be a fine metal mask (FMM). The light receiving layer OPL may be an organic photosensitive material of the photo-sensing pixel PSR.

The fourth holes H2 may be spaced apart from each other. In the embodiment, the fourth holes H4 may be designed to have different sizes from the first holes H1 of the second mask M2, the second holes H2 of the third mask M3, and the third hole H3 of the fourth mask M4.

Each of the fourth holes H4 may have a square shape in which a width in the first direction DR1 and a width in the second direction DR2 are substantially the same. In the embodiment, each of the fourth holes H4 is for forming the light receiving layer OPL in the second opening OP2 of the pixel defining film PDL, and a size thereof may be substantially the same as or similar to that of the second opening OP2.

A material (or an organic material) that has passed through each of the fourth holes H4 of the fifth mask M5 may be applied in the second opening OP2 of the pixel defining film PDL to configure the light receiving layer OPL of the photo-sensing pixel PSR. The light receiving layer OPL may have a planar shape corresponding to each of the fourth holes H4 and the second opening OP2. The light receiving layer OPL of the photo-sensing pixel PSR has a square planar shape, so that an area (or a size) of the light receiving area FXA of the photo-sensing pixel PSR defined by the light receiving layer OPL may be determined.

Figure 14:
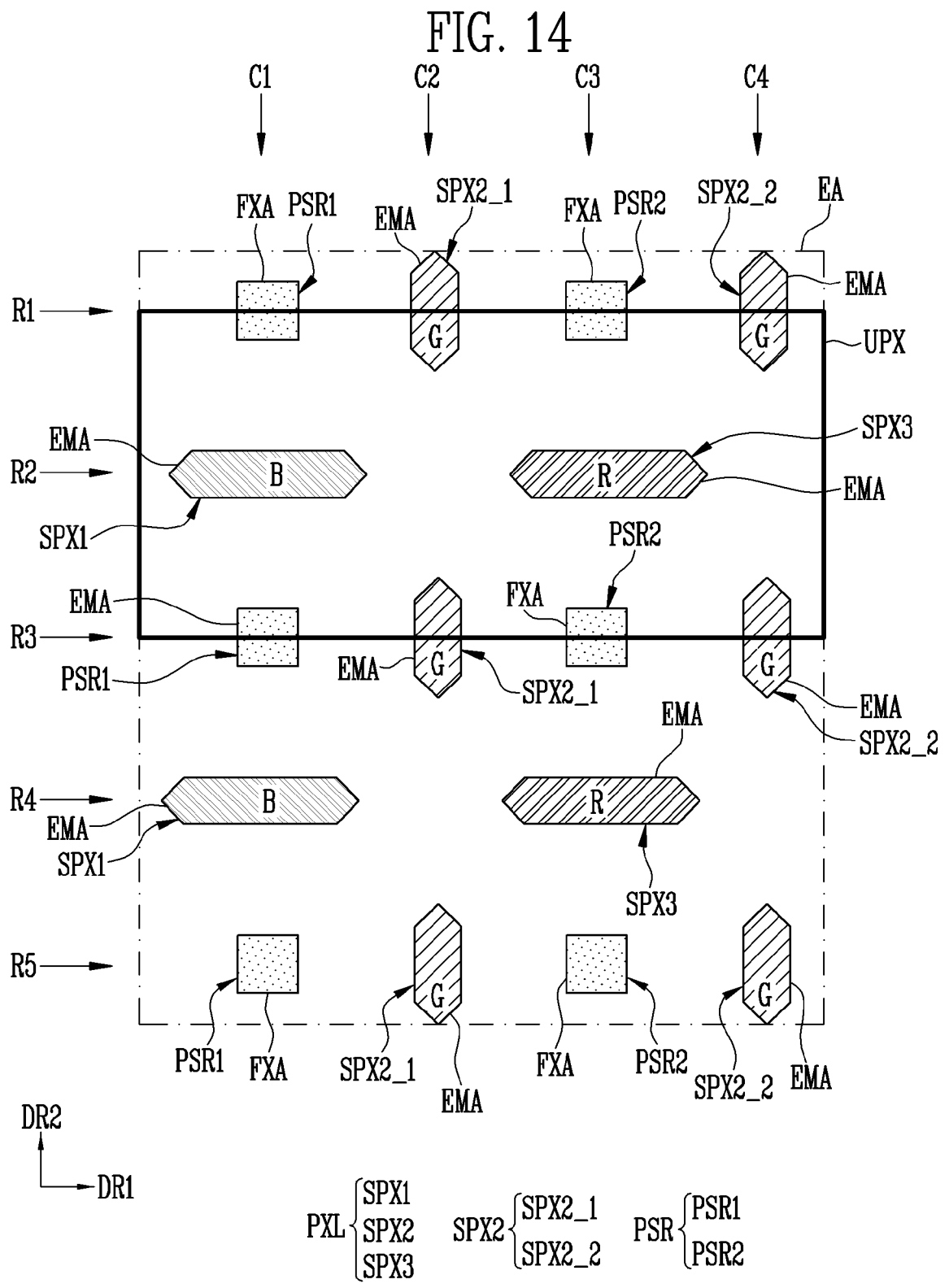
FIG. 14 illustrates an enlarged view of a portion 'EA' of the display device of FIG. 2.

FIG. 14 illustrates an enlarged view of a portion 'EA' of the display device of FIG. 2.

In FIG. 14, differences from the above-described embodiment will be mainly described in order to avoid duplicate descriptions, and constituent elements not specifically described refer to the embodiment described above, the same reference numerals designate the same constituent elements, and the similar reference numerals designate the similar constituent elements and so to the extent that an element is not described in detail, it may be understood that the element is at least similar to a corresponding element that has been described elsewhere within the present disclosure.

FIG. 14 illustrates a modified embodiment of the embodiment of FIG. 6 in relation to the arrangement of the first and third sub-pixels SPX1 and SPX3.

Referring to FIG. 2 and FIG. 14, the first photo-sensing pixel PSR1 and the first sub-pixel SPX1 may be alternately disposed in the second direction DR2 to form a first column C1. For example, in the first column C1, the first photo-sensing pixel PSR1 receiving light, the first sub-pixel SPX1 emitting blue light (B), the first photo-sensing pixel PSR1 receiving light, the first sub-pixel SPX1 emitting blue light (B), and the first photo-sensing pixel PSR1 receiving light may be sequentially disposed.

In the embodiment, the second photo-sensing pixel PSR2 and the third sub-pixel SPX3 may be alternately disposed in the second direction DR2 to form a third column C3. For example, in the third column C3, the second photo-sensing pixel PSR2 receiving light, the third sub-pixel SPX3 emitting red light (R), the second photo-sensing pixel PSR2 receiving light, the third sub-pixel SPX3 emitting red light (R), and the second photo-sensing pixel PSR2 receiving light may be sequentially disposed.

In each of second and fourth columns C2 and C4, the second sub-pixels SPX2 disposed alternatively with the first sub-pixels SPX1 disposed in the first column C1 and the third sub-pixels SPX3 disposed in the third column C3 may be disposed. The second sub-pixels SPX2 may include (2-1)-th sub-pixels SPX2_1 disposed in the second column C2 and disposed in the same row as the first photo-sensing pixel PSR1 and (2-2)-th sub-pixels SPX2_2 disposed in the fourth column C4 and disposed in the same row as the second photo-sensing pixel PSR2.

In the embodiment, each of the first to third sub-pixels SPX1 to SPX3 may include the light emitting area EMA having a polygonal (for example, hexagonal) planar shape extending along one direction (for example, the first direction DR1 or the second direction DR2). In addition, each of the first and second photo-sensing pixels PSR1 and PSR2 may include the light receiving area FXA having a square planar shape in which a width (or a horizontal width) in the first direction DR1 and a width (or a vertical width) in the second direction DR2 are substantially the same.

Figure 15:
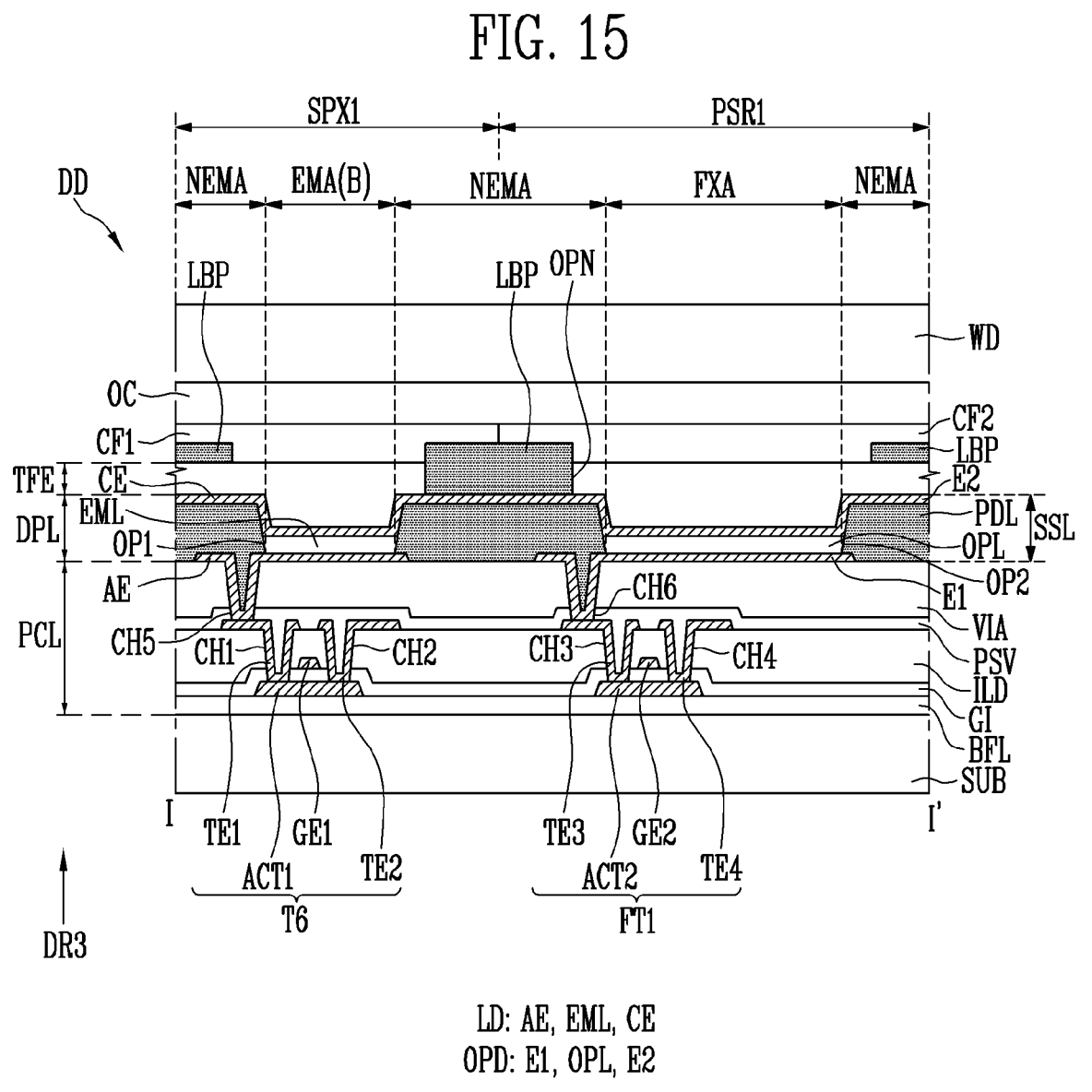
Figure 16:
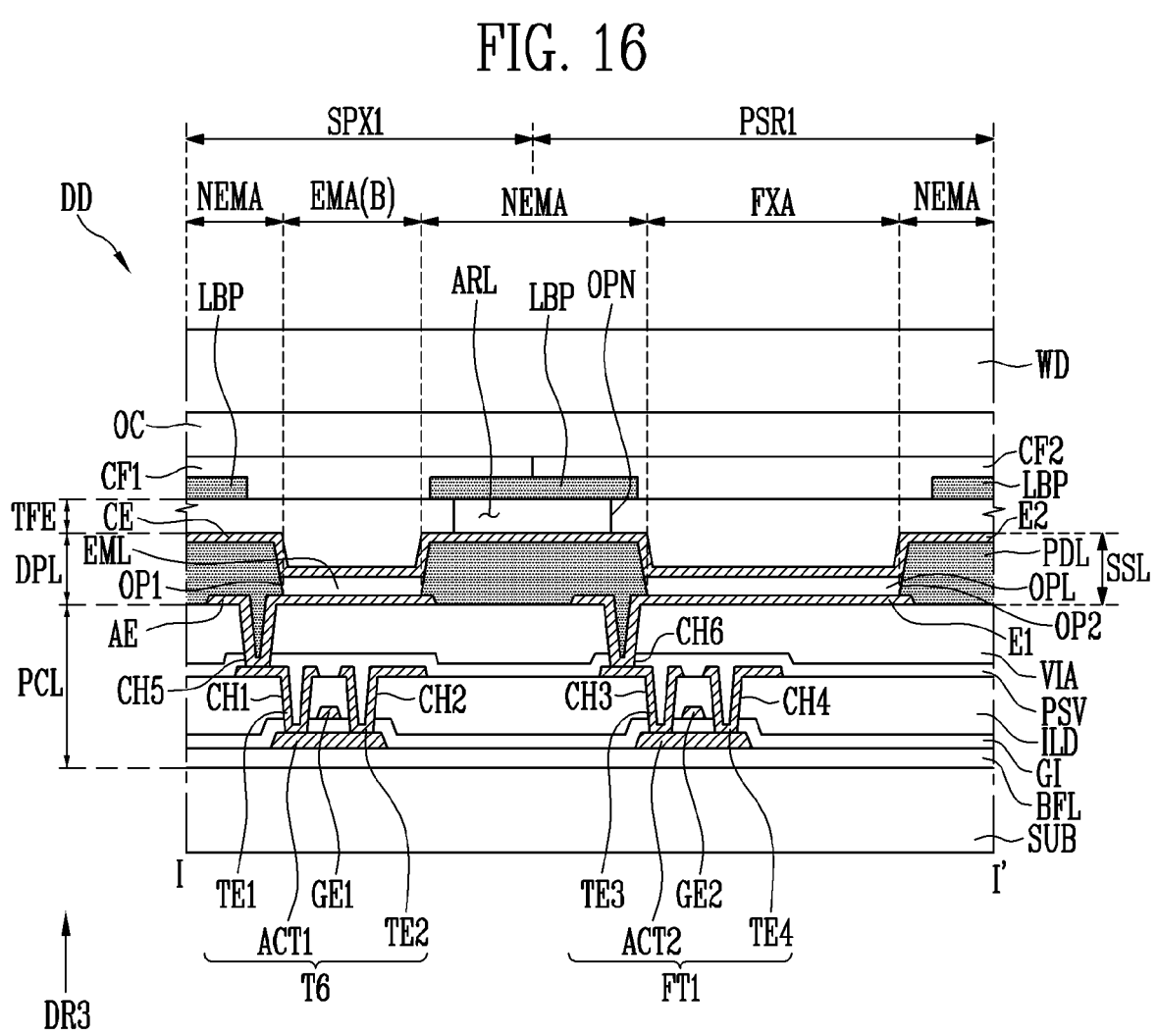
Figure 17:
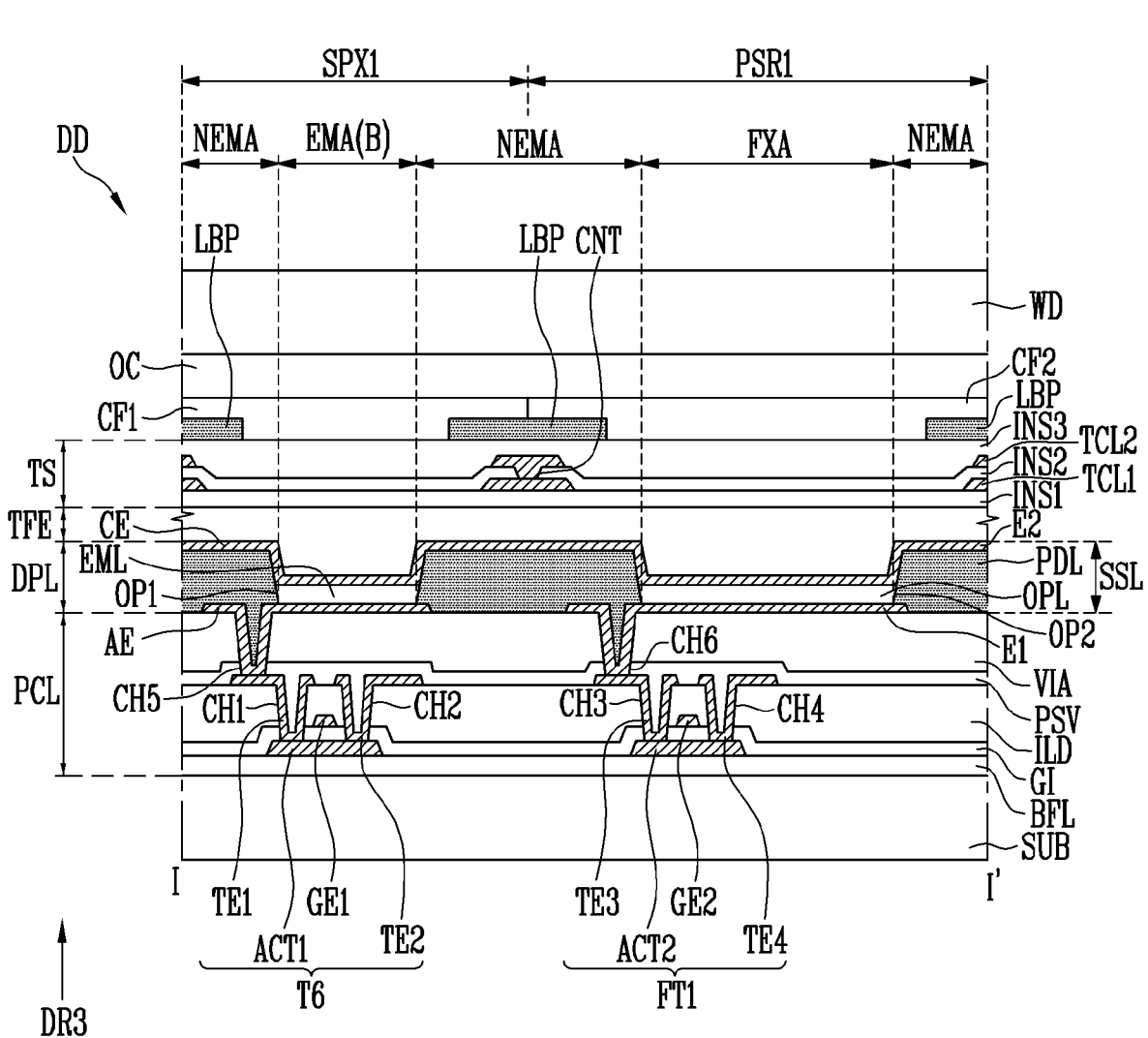

FIGS. 15 to 17 illustrate schematic cross-sectional views of a display device DD according to embodiments of the present invention.

In FIGS. 15 to 17, differences from the above-described embodiment will be mainly described in order to avoid duplicate descriptions. In addition, in FIGS. 15 to 17, constituent elements not specifically described refer to the embodiment described above, the same reference numerals designate the same constituent elements, and the similar reference numerals designate the similar constituent elements and so to the extent that an element is not described in detail, it may be understood that the element is at least similar to a corresponding element that has been described elsewhere within the present disclosure.

FIGS. 15 and 16 illustrate modified embodiments of the embodiment of FIG. 7 in relation to the thin film encapsulation layer TFE and the like.

FIG. 17 illustrates a modification embodiment of the embodiment of FIG. 7 in relation to an additional element (the touch sensor TS).

First, referring to FIG. 15, the thin film encapsulation layer TFE may be partially opened to include an opening OPN exposing the cathode electrode CE of the first sub-pixel SPX1 and the second electrode E2 of the first photo-sensing pixel PSR1.

The light blocking pattern LBP may protrude from the upper surface of the thin film encapsulation layer TFE in the third direction DR3 while filling the opening OPN. The light blocking pattern LBP may be provided in the opening OPN of the thin film encapsulation layer TFE to correspond to the non-light emitting area NEMA disposed between the light emitting area EMA of the first sub-pixel SPX1 and the light receiving area FXA of the first photo-sensing pixel PSR1.

The light blocking pattern LBP may block the blue light B emitted from the light emitting element LD (or the light emitting layer EML) of the first sub-pixel SPX1 from directly proceed to the light receiving element OPD of the first photo-sensing pixel PSR1.

In some embodiments, an air layer ARL may be formed in the opening OPN of the thin film encapsulation layer TFE as shown in FIG. 16 instead of the light blocking pattern LBP. Due to a difference in refractive index with the thin film encapsulation layer TFE, the air layer ARL may block the blue light B emitted from the light emitting element LD (or the light emitting layer EML) of the first sub-pixel SPX1 from directly proceed to the light receiving element OPD of the first photo-sensing pixel PSR1. The light blocking pattern LBP may cover the air layer ARL.

Next, referring to FIG. 17, the touch sensor TS may be further disposed on the thin film encapsulation layer TFE.

The touch sensor TS may include a first insulation layer INS1, a second insulation layer INS2, a third insulation layer INS3, and first and second touch conductive layers TCL1 and TCL2. Each of the above-described layers may be configured as a single layer, but is not necessarily limited thereto, and may be configured as a stacked layer including a plurality of layers according to embodiments. Another layer may be further disposed between respective layers.

The first insulation layer INS1 may include an inorganic insulation film including an inorganic material or an organic insulation film including an organic material. The inorganic insulation film may include an inorganic insulation material such as a silicon oxide (SiOx), a silicon nitride (SiNx), a silicon oxynitride (SiOxNy), an aluminum oxide (AlxO3), a titaniumoxide (TiOx), a tantalum oxide (TaxOy), a hafnium oxide (HfOx), or a zinc oxide (ZnOx). The zinc oxide (ZnOx) may be a zinc oxide (ZnO) and/or a zinc peroxide (ZnO2). The organic insulation film may include an acryl-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and/or a perylene-based resin.

In some embodiments, the first insulation layer INS1 may be omitted, or may be configured as the uppermost layer of a thin film encapsulation layer TFE.

The first touch conductive layer TCL1 may be provided and/or formed on the first insulation layer INS1. The first touch conductive layer TCL1 may have a single-layered structure or a multi-layered structure stacked in a thickness direction (for example, the third direction DR3). The single-layered touch conductive layer may include a metal layer or a transparent conductive layer. The metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnOx), and an indium tin zinc oxide (ITZO). In addition, the transparent conductive layer may include PEDOT, a metal nano wire, and graphene. The first touch conductive layer TCL1 may form a first layer of a plurality of touch electrodes.

The first touch conductive layer TCL1 may be disposed on one surface of the first insulation layer INS1 to overlap the pixel defining film PDL in order to prevent aperture ratios of the first sub-pixel SPX1 and the first photo-sensing pixel PSR1 from being lowered. For example, in order to secure the image quality and the amount of light received, the first touch conductive layer TCL1 may avoid the light emitting area EMA of the first sub-pixel SPX1 and the light receiving area FXA of the first photo-sensing pixel PSR1 to be disposed on one surface of the first insulation layer INS1.

The second insulation layer INS2 may be entirely provided and/or formed on the first touch conductive layer TCL1 and the first insulation layer INS1. The second insulation layer INS2 may be disposed between the first touch conductive layer TCL1 and the second touch conductive layer TCL2 to electrically insulate the first touch conductive layer TCL1 and the second touch conductive layer TCL2. The second insulation layer INS2 may include the same material as the first insulation layer INS1 described above, or may include one or more materials selected from the materials illustrated as constituent materials of the first insulation layer INS1. For example, the second insulation layer INS2 may include an inorganic film, but is not necessarily limited thereto.

The second insulation layer INS2 may be partially opened to include a contact portion CNT exposing one area of the first touch conductive layer TCL1.

The second touch conductive layer TCL2 may be provided and/or formed on the second insulation layer INS2. The second touch conductive layer TCL2 may include the same material as the first touch conductive layer TCL1 described above, or may include one or more materials selected from the materials illustrated as constituent materials of the first touch conductive layer TCL1. The second touch conductive layer TCL2 may form a second layer of a plurality of touch electrodes. The second touch conductive layer TCL2 may be electrically connected to the first touch conductive layer TCL1 through the contact portion CNT of the second insulation layer INS2. The second touch conductive layer TCL2 may be disposed on one surface of the second insulation layer INS2 to overlap the pixel defining film PDL in order to prevent the aperture ratios of the first sub-pixel SPX1 and the first photo-sensing pixel PSR1 from being lowered. For example, in order to secure the image quality and the amount of light received, the second touch conductive layer TCL2 may avoid the light emitting area EMA of the first sub-pixel SPX1 and the light receiving area FXA of the first photo-sensing pixel PSR1 to be disposed on one surface of the second insulation layer INS1.

The third insulation layer INS3 may be entirely provided and/or formed on the second touch conductive layer TCL2 and the second insulation layer INS2. The third insulation layer INS3 may include an organic film, but is not necessarily limited thereto. In some embodiments, the third insulation layer INS3 may be formed of an inorganic film, or may have a structure in which an organic film and an inorganic film are alternately stacked.

According to the display device according to the embodiments of the present invention, it is possible to display image information and to sense user biometric fingerprint information, by positioning a sub-pixel including a light emitting element and a photo-sensing pixel for sensing light on the same substrate.

In addition, the display device according to the embodiments of the present invention may include a light emitting area of a sub-pixel designed to have a polygonal planar shape extending along one direction and a light receiving area of a photo-sensing pixel designed to have a quadrilateral planar shape.

Accordingly, an area of the photo-sensing pixel (or an area of a light receiving area) may be secured, so that sensing ability of the display device for sensing external light may be increased, and an area of the sub-pixel (or an area of a light emitting area) may be maximally secured, so that light emitting efficiency may be increased.

However, the effects of the present invention are not necessarily limited to the above-described effects, and may be variously extended without departing from the spirit and scope of the present invention.

While this invention has been described in connection with what is presently considered to be practical embodiments, it is to be understood that the invention is not necessarily limited to the disclosed embodiments, but, on the contrary, is intended to cover various modifications and equivalent arrangements included within the spirit and scope of the present disclosure.

What is claimed is:

1. A display device, comprising:
a substrate; and
a plurality of unit pixels disposed on the substrate and including sub-pixels and photo-sensing pixels,
    wherein each of the sub-pixels includes a light emitting element and a light emitting area from which light is emitted,
    wherein each of the photo-sensing pixels includes a light receiving area and a light receiving element disposed therein and outputting a sensing signal corresponding to a degree of sensed light,
    wherein the light emitting area and the light receiving area are spaced apart from each other on the substrate,
    wherein the light emitting area and the light receiving area each have a polygonal shape in a plan view,
    wherein a shape of the light emitting area in the plan view is different from a shape of the light receiving area in the plan view,
    wherein each of the plurality of unit pixels includes a first sub-pixel having the light emitting area that is longer in a first direction than in a second direction, a second sub-pixel having the light emitting area that is longer in the first direction than in the second direction, and a third sub-pixel having the light emitting area that is longer in the second direction than in the first direction, and
    wherein the light receiving area of one of the photo-sensing pixels is disposed between the first sub-pixel and the second sub-pixel in the second direction and is disposed between third sub-pixels in the first direction.

2. The display device of claim 1, wherein the light emitting area has a hexagonal shape, and the light receiving area has a quadrilateral shape.

3. The display device of claim 2,
wherein the light receiving area has a square shape.

4. The display device of claim 3, wherein one of the plurality of unit pixels includes:
    a first sub-pixel disposed on a first column of the substrate;
    two (2-1)-th sub-pixels disposed on a second column that is adjacent to the first column in a first direction;
    a third sub-pixel disposed on a third column that is adjacent to the second column in the first direction;
    two (2-2)-th sub-pixels disposed on a fourth column that is adjacent to the third column in the first direction;
    two first photo-sensing pixels disposed on the first column; and
    two second photo-sensing pixels disposed on the third column.

5. The display device of claim 4, wherein the two (2-1)-th sub-pixels and the two (2-2)-th sub-pixels emit light of a same color; and
    wherein colors of light emitted by the two (2-1)-th sub-pixels and the two (2-2)-th sub-pixels, a color of light emitted by the first sub-pixel, and a color of light emitted by the third sub-pixel are all different from one another.

6. The display device of claim 4, wherein the two first photo-sensing pixels face each other with the first sub-pixel therebetween in the first column, and
    wherein the two second photo-sensing pixels face each other with the third sub-pixel therebetween in the third column.

7. The display device of claim 6, wherein the first sub-pixel and the third sub-pixel are disposed in a same row, and
    wherein a distance between the first sub-pixel and the third sub-pixel in the same row is different from a distance between the first sub-pixel and the first photo-sensing pixel in the first column.

8. The display device of claim 4, wherein each of the first sub-pixel and the third sub-pixel includes a light emitting area having a hexagonal shape extending primarily in the first direction, and
    wherein each of the two (2-1)-th sub-pixels and the two (2-2)-th sub-pixels includes a light emitting area of a hexagonal shape extending primarily in a second direction crossing the first direction.

9. The display device of claim 4, wherein the one unit pixel among the plurality of unit pixels and an adjacent unit pixel among the plurality of unit pixels disposed in a same column as the one unit pixel, in a second direction crossing the first direction, share the two first photo-sensing pixels or the two second photo-sensing pixels.

10. The display device of claim 3, wherein the light emitting element includes an anode electrode, a light emitting layer disposed on the anode electrode, and a cathode electrode disposed on the light emitting layer, and wherein the light receiving element includes a first electrode, a light receiving layer disposed on the first electrode, and a second electrode disposed on the light receiving layer.

11. The display device of claim 10, wherein the cathode electrode of the light emitting element and the second electrode of the light receiving element are part of a continuous single structure and are electrically connected to one another.

12. The display device of claim 10, further comprising:

a pixel defining film that is disposed on the anode electrode of the light emitting element and the first electrode of the light receiving element and includes a first opening exposing a portion of the anode electrode and a second opening exposing a portion of the first electrode; and a thin film encapsulation layer that is disposed on the cathode electrode of the light emitting element and the second electrode of the light receiving element and at least partially covers the light emitting element and the light receiving element.

13. The display device of claim 12, wherein the first opening corresponds to the light emitting area, and the second opening corresponds to the light receiving area.

14. The display device of claim 12, further comprising:

a first color filter disposed on the thin film encapsulation layer in the light emitting area;

a second color filter disposed on the thin film encapsulation layer in the light receiving area; and a light blocking pattern disposed between the first color filter and the second color filter.

15. The display device of claim 14, wherein the thin film encapsulation layer includes an opening exposing a portion of each of the cathode electrode of the light emitting element and the second electrode of the light receiving element between the light emitting area and the light receiving area; and wherein the light blocking pattern fills the opening in an area between the light emitting area and the light receiving area.

16. The display device of claim 14, wherein the thin film encapsulation layer includes an opening exposing a portion of each of the cathode electrode of the light emitting element and the second electrode of the light receiving element between the light emitting area and the light receiving area, and wherein an air layer is disposed within the opening.

17. The display device of claim 14, further comprising:

a touch sensor disposed between the thin film encapsulation layer and the first and second color filters.

18. A display device, comprising:

a substrate;

a plurality of sub-pixels, each including a pixel circuit including at least one transistor disposed on the substrate and a light emitting element electrically connected to the pixel circuit; and a plurality of photo-sensing pixels, each including a sensor circuit including at least one sensor transistor disposed on the substrate and a light receiving element electrically connected to the sensor circuit, wherein each of the plurality of sub-pixels includes a light emitting area from which light is emitted from the light emitting element, wherein each of the plurality of photo-sensing pixels includes a light receiving area, wherein the light emitting area and the light receiving area are spaced apart from each other on the substrate, wherein the light emitting area and the light receiving area each have a polygonal shape in a plan view, wherein a shape of the light emitting area in the plan view is different from a shape of the light receiving area in the plan view, wherein the plurality of sub-pixels includes a first sub-pixel, the light emitting area of which is longer in a first direction than in a second direction, a second sub-pixel, the light emitting area of which is longer in the first direction than in the second direction, and a third sub-pixel, the light emitting area of which is longer in the second direction than in the first direction, and wherein the light receiving area of one of the plurality of photo-sensing pixels is disposed between the first sub-pixel and the second sub-pixel in the second direction and is disposed between the third sub-pixels in the first direction.

19. The display device of claim 18, wherein the light emitting area has a hexagonal shape, and the light receiving area has a quadrilateral shape.

20. The display device of claim 19, wherein the light receiving area has a square shape.

* * * * *